US009846363B2

(12) United States Patent
Yoshihara et al.

(10) Patent No.: US 9,846,363 B2
(45) Date of Patent: Dec. 19, 2017

(54) PROCESSING LIQUID SUPPLYING APPARATUS AND METHOD OF SUPPLYING PROCESSING LIQUID

(71) Applicant: TOKYO ELECTRON LIMITED, Tokyo (JP)

(72) Inventors: Kousuke Yoshihara, Koshi (JP); Koji Takayanagi, Koshi (JP); Toshinobu Furusho, Koshi (JP); Takashi Sasa, Koshi (JP); Daisuke Ishimaru, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 163 days.

(21) Appl. No.: 14/528,290

(22) Filed: Oct. 30, 2014

(65) Prior Publication Data
US 2015/0125793 A1   May 7, 2015

(30) Foreign Application Priority Data
Nov. 1, 2013   (JP) .................................. 2013-228580

(51) Int. Cl.
*G03F 7/16* (2006.01)
*H01L 21/67* (2006.01)

(52) U.S. Cl.
CPC .......... *G03F 7/16* (2013.01); *H01L 21/67017* (2013.01)

(58) Field of Classification Search
None
See application file for complete search history.

(56) References Cited

U.S. PATENT DOCUMENTS

| 6,238,109 | B1 | 5/2001 | Minami | |
|---|---|---|---|---|
| 2008/0087615 | A1* | 4/2008 | Taniguchi | G03F 7/162 210/805 |
| 2009/0145489 | A1* | 6/2009 | Goto | G05D 23/1919 137/334 |
| 2013/0068324 | A1 | 3/2013 | Furusho et al. | |

FOREIGN PATENT DOCUMENTS

| DE | WO 2011138881 A1 * | 11/2011 | ....... H01L 21/67017 |
|---|---|---|---|
| JP | 2001-077015 A1 | 3/2001 | |
| JP | 2011-238666 A1 | 11/2011 | |
| WO | 2006/057345 A1 | 6/2006 | |

* cited by examiner

*Primary Examiner* — Charles Capozzi
(74) *Attorney, Agent, or Firm* — Burr & Brown, PLLC

(57) ABSTRACT

A processing liquid supplying apparatus performs an ejecting step in which a processing liquid suctioned into a pump passes through a filter device and is ejected from an ejecting part without returning the processing liquid back to the pump; a returning step in which the processing liquid suctioned into the pump is returned to a processing liquid source side of a mixing section; and a replenishing step in which the processing liquid returned to the processing liquid source side is suctioned into the pump together with the processing liquid replenished from the processing liquid source. The processing liquid passes through the filter device in at least one of the returning step and the replenishing step. The amount of the processing liquid returned to the processing liquid source side in the returning step is larger than the amount of the processing liquid ejected from the ejecting part in the ejecting step.

4 Claims, 32 Drawing Sheets

PROCESSING LIQUID SUPPLYING APPARATUS AND METHOD OF SUPPLYING PROCESSING LIQUID

CROSS-REFERENCE TO RELATED APPLICATIONS

This application is based upon and claims the benefit of priority from Japanese patent application No. 2013-228580 filed on Nov. 1, 2013, the entire contents of which are incorporated herein by reference.

FIELD OF THE INVENTION

The present invention relates to a processing liquid supplying apparatus and a processing liquid method, for supplying a processing liquid to a surface of a process substrate, such as a semiconductor wafer or an LCD glass substrate.

BACKGROUND ART

In a general photolithographic technique for manufacturing semiconductor devices, a photoresist is applied to a substrate, such as a semiconductor wafer or an FPD substrate. A resist film thus formed is then exposed with a predetermined circuit pattern, and the exposed pattern is developed so that the circuit pattern is formed in the resist film.

In such a photolithographic process, bubbles of nitrogen gas and particles (foreign matters) may come to be mixed in a processing liquid, such as a resist liquid and a developer to be supplied to a substrate, for various reasons. When a processing liquid containing bubbles and/or particles is supplied to a substrate, coating may be non-uniform and/or a defect may occur. Thus, a processing liquid supplying apparatus, which applies a processing liquid to a substrate, is provided with a filter for removing bubbles and particles contained in the processing liquid by filtration.

There is known a processing liquid supplying apparatus including a plurality of filters which serve as an apparatus for improving an efficiency for filtering bubbles and particles contained in a processing liquid. The processing liquid supplying apparatus supplies, to a wafer or the like, a processing liquid having been passed through these filters. If a plurality of filters are installed in a processing liquid supplying apparatus, it becomes larger and must be modified drastically.

JP2011-238666A (see the claims and FIG. 7) discloses a chemical liquid supplying system of a circulating filtration type, including: a first container for storing a chemical liquid (processing liquid); a second container for storing the chemical liquid; a first pump disposed on a first pipeline connecting the first container and the second container to feed the chemical liquid stored in the first container toward the second container; a first filter disposed in the first pipeline; a second pipeline connecting the first container and the second container; and a second pump disposed on the second pipeline to feed the chemical liquid stored in the second container toward the first container.

WO2006/057345 (see the claims and FIG. 4) discloses another processing liquid supplying apparatus of a circulating filtration type provided with a single filter. The apparatus includes: a buffer container for a photoresist liquid (processing liquid); a circulating filtration device that draws a part of the photoresist liquid from the buffer container to filtrate the same, and then returns the filtered photoresist liquid to the buffer container; and a piping for sending the photoresist liquid from the buffer container or the circulating filtration device to a photoresist coating device. JP2001-77015A discloses an arrangement in which pumps are respectively disposed on the primary side and the secondary side of a filter.

In the processing liquid supplying apparatuses disclosed in JP2011-238666A and WO2006/057345, the chemical liquid (processing liquid) having been filtered by the filter(s) is returned to the first container (buffer container), and the chemical liquid returned to the first container is ejected to a wafer. In order to improve the chemical-liquid filtration efficiency, it is necessary to further circulate the chemical liquid once returned to the first container so as to filtrate the chemical liquid plural times. It elongates the standby time and lowers the throughput of the apparatus.

With the recent improved resolution of particle inspection apparatuses and pattern inspection apparatuses, particles of a currently negligible size in a processing liquid would be found to be problematic in the future. By taking measures for removing such micro particles, a throughput of semiconductor devices can be enhanced. Thus, a processing liquid supplying system is more and more required to have measures for restraining particles. For example, dust generated from a pump in a processing liquid supplying passage cannot be ignored any more.

The object of the present invention is to provide a technique capable of capturing foreign matters in a processing liquid at a high capturing rate.

SUMMARY OF THE INVENTION

In one embodiment of the present invention, there is provided a processing liquid supplying apparatus of the present invention is a processing liquid supplying apparatus that supplies a processing liquid supplied from a processing liquid source via an ejecting part to a process object, the apparatus including: a processing liquid supplying passage connecting the processing liquid source to the ejecting part; a mixing section having a circulation passage which is provided thereon with a pump and a filter device connected to a secondary side of the pump, the mixing section being disposed on the processing liquid supplying passage between the processing liquid source and the ejecting part to allow the processing liquid having been passed through the filter device and the processing liquid replenished from the processing liquid source to be mixed with each other; and a control section configured to output a control signal, upon receipt of which the processing liquid supplying apparatus performs: an ejecting step in which the processing liquid having been suctioned into the pump is passed through the filter device and is ejected from the ejecting part without returning the processing liquid back to the pump; a returning step in which the processing liquid having been suctioned into the pump is returned to a processing liquid source side of the mixing section; and a replenishing step in which the processing liquid having been returned to the processing liquid source side is suctioned into the pump together with the processing liquid replenished from the processing liquid source, wherein the filter device is disposed to allow the processing liquid to pass through the filter device in at least one of the returning step and the replenishing step, and wherein an amount of the processing liquid returned to the processing liquid source side in the returning step is larger than an amount of the processing liquid ejected from the ejecting part in the ejecting step.

In another embodiment of the present invention, there is provided a method of supplying a processing liquid of the present invention is a method of supplying a processing liquid from a processing source through an ejecting part to a process object, the method including: providing a mixing section, the mixing section having a circulation passage which is provided thereon with a pump and a filter device connected to a secondary side of the pump, the circulation passage extending from a primary side to the secondary side of the pump, the mixing section being disposed on the processing liquid supplying passage between the processing liquid source and the ejecting part so as to mix the processing liquid having been passed through the filter device and the processing liquid replenished from the processing liquid source; an ejecting step in which the processing liquid having been suctioned into the pump is passed through the filter device and is ejected from the ejecting part without returning the processing liquid back to the pump; a returning step in which the processing liquid having been suctioned into the pump is returned to a processing liquid source side of the mixing section; and a replenishing step in which the processing liquid having been returned to the processing liquid source side is suctioned into the pump together with the processing liquid replenished from the processing liquid source, wherein the processing liquid passes through the filter device in at least one of the returning step and the replenishing step, and wherein an amount of the processing liquid returned to the processing liquid source side in the returning step is larger than an amount of the processing liquid ejected from the ejecting part in the ejecting step.

In the foregoing embodiments, when a processing liquid from the processing liquid source is ejected from the ejecting part such as a nozzle, the primary side of the filter device is connected to the secondary side of the pump, the processing liquid having been passed through the filter device is returned to the processing liquid source side, and the returned processing liquid and the processing liquid replenished from the processing liquid source are mixed. At least when the processing liquid is returned to the processing liquid source side or when the mixed processing liquid is suctioned into the pump, the processing liquid is passed through the filter device. Thus, foreign matters in the processing liquid can be captured at a high capturing rate even if a small number of filter devices, e.g., only one filter device is employed.

DETAILED DESCRIPTION OF THE INVENTION

Embodiments of the present invention will be explained herebelow with reference to the accompanying drawings. Herein, there is explained a case in which the processing liquid supplying apparatus (resist liquid supplying apparatus) in one embodiment of the present invention is installed in a coating and developing apparatus.

Figure 1:
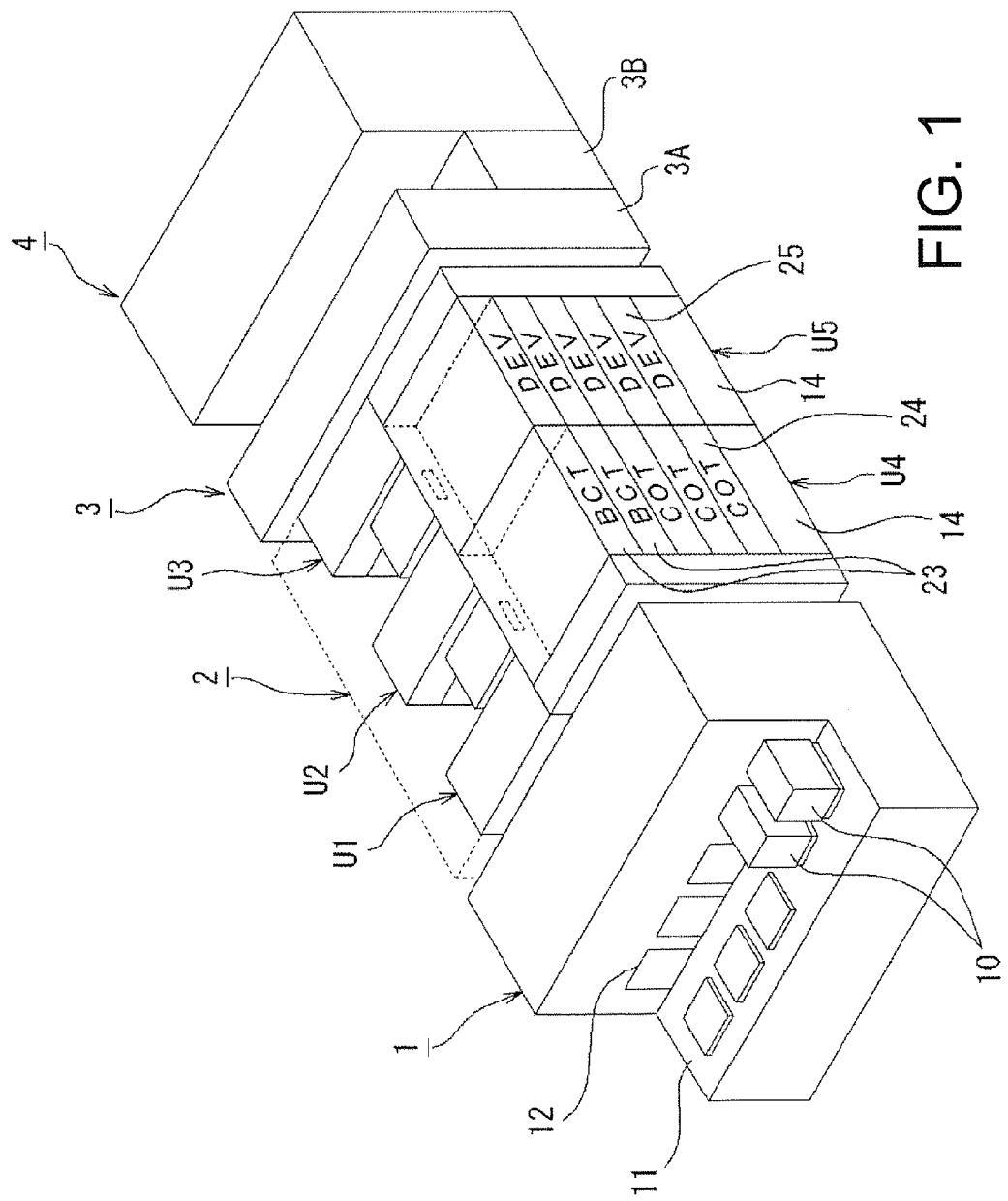
FIG. 1 is a schematic perspective view showing the whole configuration of a processing system, including a coating and developing apparatus to which the processing liquid supplying apparatus according to the present invention is installed, with an exposure apparatus connected to the coating and developing apparatus.
Figure 2:
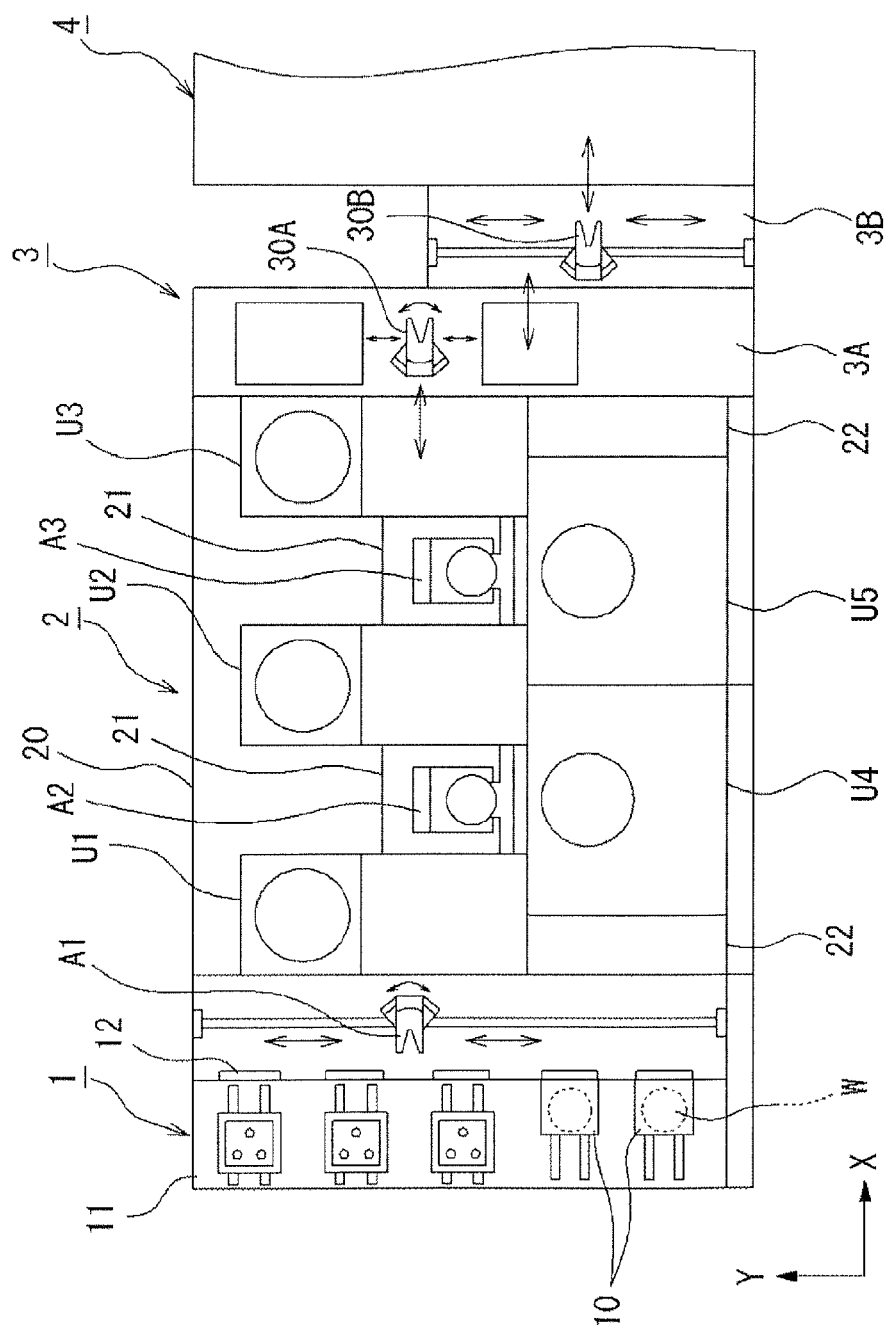
FIG. 2 is a schematic plan view of the processing system.

As shown in FIGS. 1 and 2, the coating and developing apparatus includes: a carrier station 1 through which a carrier 10, which sealingly contains a plurality of, e.g., twenty five wafers W as process-target substrates, is loaded and unloaded; a processing part 2 that applies a resist to the wafer W, which has been taken out from the carrier station 1, and develops the wafer W; an exposure part 4 that performs immersion-exposure to a surface of the wafer W, with a light-transmissive liquid layer being formed on the surface of the wafer W; and an interface part 3 disposed between the processing part 2 and the exposure part 4 to transfer the wafer W therebetween.

The carrier station 1 is provided with a table 11 on which the plurality of carriers 10 can be arranged in a row, an opening and closing part 12 formed in a front wall surface when seen from the table 11, and transfer mechanism A1 that removes a wafer W from the carrier 10 through the opening and closing part 12. The interface part 3 is composed of a first transport chamber 3A and a second transport chamber 3B which are arranged between the processing part 2 and the exposure part 4 in the back and forth direction. The first transport chamber 3A is equipped with a first wafer transport unit 30A, and the second transport chamber 3B is equipped with a second wafer transport unit 30B.

The processing part 2 surrounded by a housing 20 is connected behind the carrier station 1. In the processing part 2, there are alternately provided main transport mechanisms A2 and A3 in this order from the front. The main transport mechanisms A2 and A3 are configured to transport a wafer W between shelf units U1, U2 and U3 which are formed by stacking heating/cooling units, and liquid processing units U4 and U5. The main transport mechanisms A2 and A3 are located in a space surrounded by a partition wall 21, which is formed by one surface part on the side of the shelf units U1, U2 and U3 that are arranged in the back and forth direction when seen from the carrier station 1, one surface part on the right below-described liquid processing units U4 and U5, for example, and a back surface part defining one left surface. A temperature and humidity regulating unit 22 including a device for regulating a temperature and a humidity of a processing liquid used in the respective units, and a duct for regulating a temperature and a humidity, and so on.

Each of the shelf units U1 U2 and U3 is formed by stacking, at a plurality of, e.g., ten levels, various units for performing pre-processes (pre-treatments) and post-processes (post-treatments) for a process performed by the liquid processing units U4 and U5. In the shelf units U1, U2 and U3, a heating unit (not shown) for heating (baking) a wafer W, cooling unit (not shown) for cooling a wafer W and so on are combined. As shown in FIG. 1, for example, each of the liquid processing units U4 and U5 for processing a wafer W by supplying thereto a predetermined processing liquid is formed by stacking, at a plurality of, e.g., five levels, on a chemical liquid containing part 14 for containing a resist and a developer, an antireflection film coating unit (BCT) 23 for applying an antireflection film, a coating unit (COT) 24 for applying a resist liquid to a wafer W, a developing unit (DEV) 25 for developing a wafer W by supplying thereto a developer. The coating unit (COT) 24 includes a processing liquid supplying apparatus in one of various embodiments, which will be described later.

One example of a flow of a wafer in the coating and developing apparatus as structured above is briefly explained with reference to FIGS. 1 and 2. Firstly, the carrier 10 containing, e.g., twenty five wafers W is placed on the table 11. Then, the opening and closing part 12 is opened, a lid of the carrier 10 is detached, and a wafer W is removed from the carrier 10 by the transfer mechanism A1. Then, the wafer W is transferred to the main transport mechanism A2 through a transition unit (not shown) of the shelf unit U1. The wafer is subjected to, for example, an antireflection film forming process and a cooling process, which are the pre-processes for the coating process. After that, the wafer W is coated with a resist liquid by the coating unit (COT) 24. Then, the wafer W is transferred by the main transport mechanism A2 to the heating unit, which is disposed in one of the shelves of the shelf units U1 to U3, and the wafer W is heated (baked) there. Thereafter, the wafer W is cooled, and is then loaded into interface part 3 through the transition unit of the shelf unit U3. In the interface part 3, the wafer W is transported to the exposure part 4 by the first wafer transport unit 30A of the first transfer chamber 3A and the second wafer transport unit 30B of the second transport chamber 3B. In the exposure part 4, an exposure unit (not shown) is disposed to face the surface of the wafer W so as to expose the surface of the wafer W. After exposed, the wafer W is reversely transported to the main transport mechanism A2, and is transported to the developing unit (DEV) 25 where the wafer W is developed so that a pattern is formed on the wafer W. Thereafter, the wafer W is returned to the original carrier 10 placed on the table 11.

Next, a first embodiment of the processing liquid supplying apparatus according to the present invention is explained.

<First Embodiment>

Figure 3:
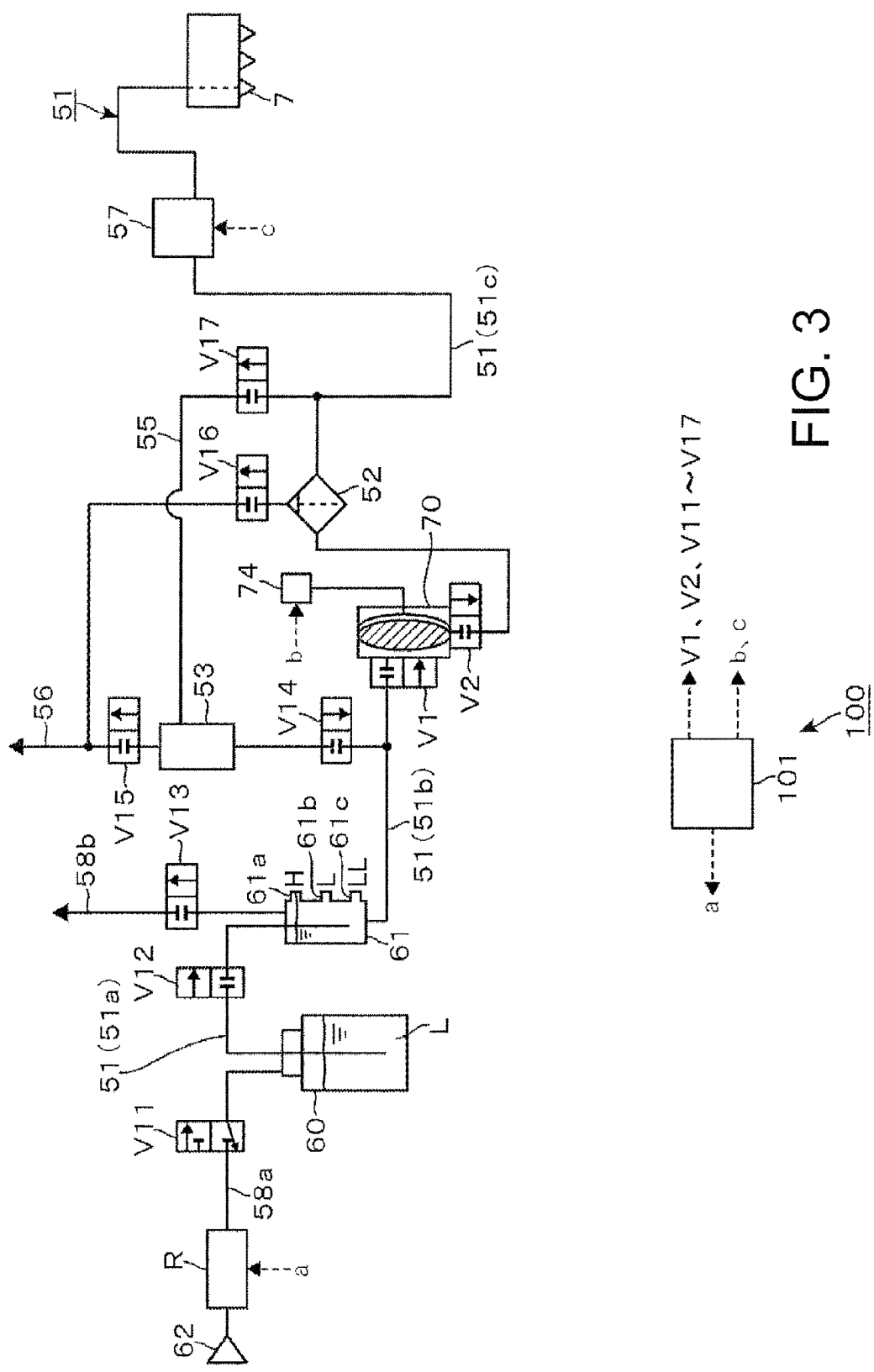
FIG. 3 is a piping diagram showing the structure of a first embodiment of the processing liquid supplying apparatus.

As shown in FIG. 3, the processing liquid supplying apparatus in the first embodiment includes: a processing liquid container 60 serving as a processing liquid source for storing a resist liquid L that is a processing liquid; a nozzle 7 that ejects (supplies) the resist liquid (processing liquid) L to a wafer (process-target substrate); and a processing liquid supplying pipeline 51 serving as a processing liquid supplying passage which connects the processing liquid container 60 to the nozzle 7. The processing liquid supplying pipeline 51 is equipped with: a buffer tank 61 for temporarily storing the processing liquid fed from the processing liquid container 60; a pump 70; and a filter 52 for filtering the resist liquid L to remove foreign matters therefrom, which are arranged in this order from the upstream side. Thus, the filter 52 is connected to the secondary side of the pump 70, whereby the processing liquid discharged from the pump 70 is fed to the nozzle 7 through the filter 52, as described below. A part of the processing liquid supplying pipeline 51 between the processing liquid container 60 and the buffer tank 61 is referred to as "first processing liquid supplying pipeline 51a". A part of the processing liquid supplying pipeline 51 between the buffer tank 61 and the pump 70 is referred to as "second processing liquid supply pipeline 51b". A part of the processing liquid supplying pipeline 51 on the downstream side of the pump 70 is referred to as "third processing liquid supply pipeline 51c". The third processing liquid supplying pipeline 51c is provided with a supply control valve 57, which includes a shutoff valve and a suck-back valve.

A return pipeline 55 (return passage) is branched from the third processing liquid supplying pipeline 51c at a junction on the secondary side of the filter 52. The return pipeline 55 is connected to the second processing liquid supplying pipeline 51b at a junction on the primary side of the pump 70. The return pipeline 55 is provided with a trap tank 53. In the illustrated embodiment, a mixing section, for mixing the resist liquid L having passed through the filter 52 and the resist liquid L replenished from the buffer tank 61, is composed of flow passages including parts of the second processing liquid supplying pipeline 51b and the third processing liquid supplying pipeline 51c extending from the joint between the second processing liquid supplying pipeline 51b and the return pipeline 55 to the joint between the third processing liquid supplying pipeline 51c, the return pipeline 55, and devices provided in that flow passage such as the pump 70. The flow passage included in the mixing section may be also referred to as "circulation passage". The filter 52 and the trap tank 53 are equipped with a drain pipeline 56 for discharging bubbles generated in the resist liquid L.

A first gas supplying pipeline 58a is connected to an upper part of the processing liquid container 60 to connect it to a nitrogen ($N_2$) gas supply source 62. The first gas supplying pipeline 58a is provided with an electro-pneumatic regulator R, which is an adjustable pressure regulating unit. The electro-pneumatic regulator R includes: an actuator such as a proportional solenoid which is operated by a control signal from a control section 101 (described later); and a valve mechanism which is opened and closed by the operation of the solenoid. The electro-pneumatic regulator R regulates pressure by opening and closing the valve mechanism. A second gas supplying pipeline 58b is disposed on an upper part of the buffer tank 61. The second gas supplying pipeline 58b is configured to release into the atmosphere an inert gas (e.g., nitrogen ($N_2$) gas) stagnating in the upper part of the buffer tank 61. Shutoff valves V11 to V16 are electromagnetic shutoff valves. The shutoff valves V11 to V16 and the electro-pneumatic regulator R are controlled by control signals from the control section 101.

The buffer tank 61 includes an upper-limit liquid level sensor 61a and a lower-limit liquid level sensor 61b to monitor predetermined liquid levels (a filling-completion level, a replenishment-requiring level) of the resist liquid L stored in the buffer tank 61. When the liquid level of the resist liquid L is detected by the upper-limit liquid level sensor 61a when the resist liquid L is being supplied from the processing liquid container 60 to the buffer tank 61, the shutoff valves V11 and V12 are closed, so that the supply of the resist liquid L from the processing liquid container 60 to the buffer tank 61 is stopped. On the other hand, when the liquid level of the resist liquid L is detected by the lower-limit liquid level sensor 61b, the shutoff valves V11 and V12 are opened, so that the supply of the resist liquid L from the processing liquid container 60 to the buffer tank 61 is started.

Figure 9:
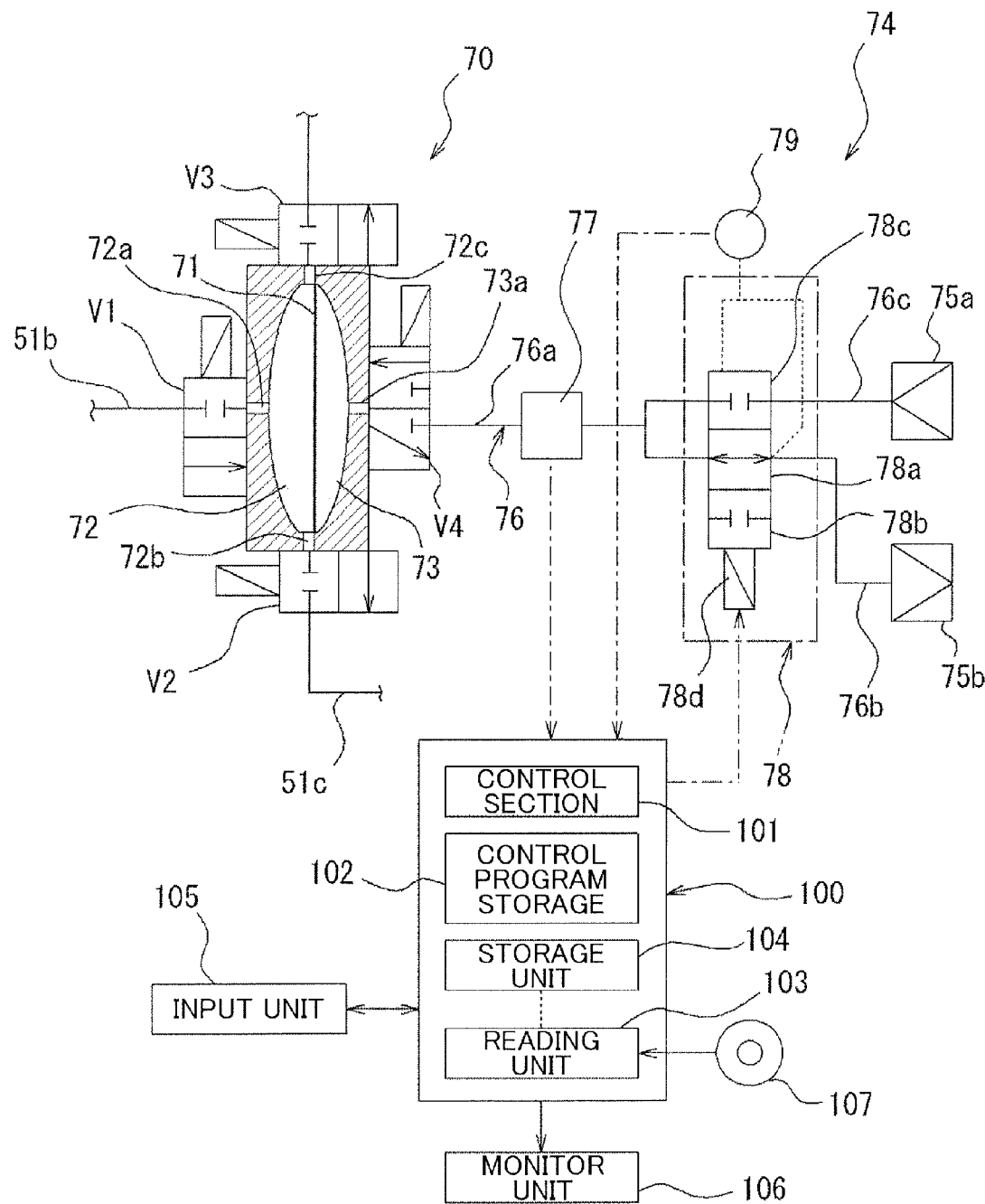
FIG. 9 is a schematic cross sectional view showing the structure of a pump used in the processing liquid supplying apparatus in the first embodiment.
Figure 10:
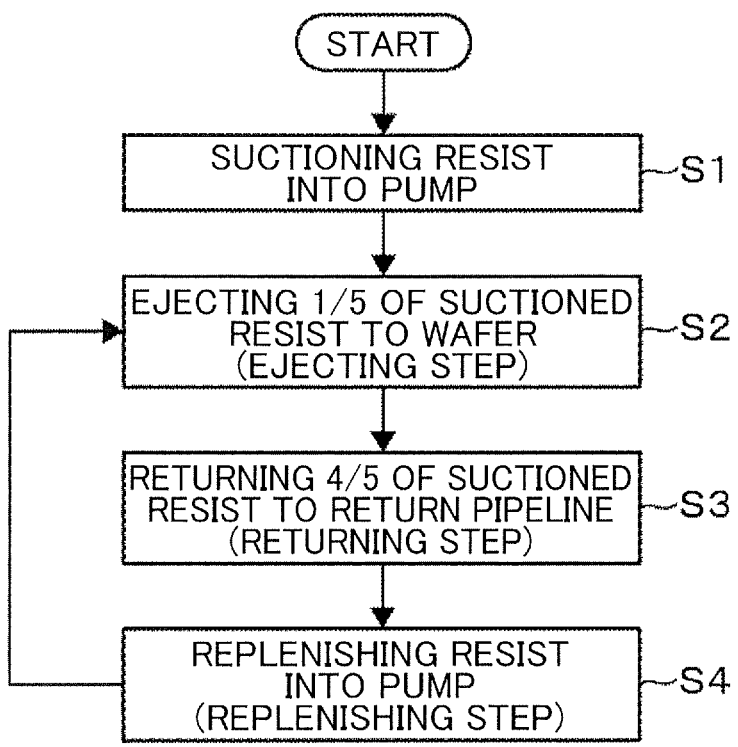
FIG. 10 is a flowchart showing a series of the pump suctioning step, the ejecting step, the returning step and the replenishing step, in the processing liquid supplying apparatus in the first embodiment.

Next, the detailed structure of the pump 70 is explained with reference to FIG. 9. The pump 70 shown in FIG. 9 is a diaphragm pump that is a variable displacement pump. The interior of the diaphragm pump 70 is divided into a pump chamber 72 and a working chamber 73 by a flexible diaphragm 71. A primary-side communication port 72a and a secondary-side communication port 72b are communicated with the pump chamber 72. The primary-side communication port 72a is connected to the second processing liquid supplying pipeline 51b through the shutoff valve V1 so as to suction the resist liquid L existing in the second processing liquid supplying path 51b. The secondary-side communication port 72b is connected to the third processing liquid supplying path 51c through the shutoff valve V2 to discharge the resist liquid L into the third processing liquid supplying pipeline 51c. The diaphragm pump 70 is also configured to discharge the resist liquid in the pump chamber 72 into another communication path (72c) upon opening the shutoff valve V3.

A driving unit 74 is connected to the working chamber 73 to control pressure a gas in the working chamber 73, based on a control signal from the control section 101. The driving unit includes a compressed air source (referred to as "pressurizing source 75a" herebelow), a reduced-pressure (vacuum) source 75b, a flowmeter 77 (flow rate sensor), an electro-pneumatic regulator 78, and a pressure sensor 79.

The working chamber 73 is provided with a pressure control port 73a connecting to the side of the driving unit 74 through a switching valve V4. A pipeline 76, which is selectively connected with the pressurizing source 75a or the reduced-pressure source 75b through the switching valve V4, is connected to the pressure control port 73a. In this case, the pipeline 76 is composed of a main pipeline 76a connecting to the working chamber 73, an exhaust pipeline 76b branched from the main pipeline 76a to connect to the reduced-pressure source 75b, and a pressuring pipeline 76c connecting to the pressurizing source 75a. The flowmeter 77 is provided on the main pipeline 76a. The electro-pneumatic regulator 78A serves as a pressure regulating mechanism for controlling the exhaust pressure in the exhaust pipeline 76b, and also as a pressure regulating mechanism for controlling the feed pressure (air pressure) in the pressuring pipeline 76c. In this case, the electro-pneumatic regulator 78 composed of: a common connecting block 78a that is selectively connected to the exhaust pipeline 76b or the pressuring pipeline 76c; two shutoff blocks 78b and 78c that block the communication of the exhaust pipeline 76b or the pressuring pipeline 76c to the pump 70; and an electromagnetic switching unit 78b for switching positions of the those blocks 78a, 78b and 78c. The electro-pneumatic regulator 78 is equipped with a pressure sensor 79, whereby pressure in the working chamber 73 connected to the pipeline 76 can be detected by the pressure sensor 79.

The flowmeter 77, the pressure sensor 79 and the electro-pneumatic regulator 78, which constitute the driving unit 74, are electrically connected to the control section 101. The flow rate of exhaust air in the pipeline 76 detected by the flowmeter 77 and the pressure in the pipeline 76 detected by the pressure sensor 79 are transmitted (inputted) to the control section 101, and a control signal is transmitted (outputted) from the control section 101 to the electro-pneumatic regulator 78. In FIG. 9, the primary-side communication port 72a is located on the left side of the pump 70, and a circulation-side communication path 72c and the secondary-side communication port 72b are respectively located on upper and lower sides of the pump 70. However, the primary-side communication port 72a and the secondary-side communication port 72b are located at different positions in the drawings other than FIG. 9.

The control section 101 is incorporated in a computer 100. The computer includes, in addition to the control section 101, a control program storage 102 for storing control programs, a reading unit 103 for reading data from outside, and a storage unit 104 for storing data. The control computer 100 further includes an input unit 105 connected to the control section 101, a monitor unit 106, and a computer-readable storage medium 107 to be mounted on the scanning unit 103. The storage medium 107 stores software for allowing the control computer 100 to execute a control program. The control program is configured to perform a group of steps including an ejecting step, a returning step and a replenishing step, which will be described later. Specifically, the group of steps is configured for performing operations for opening and closing the valves and for turning on and off the pump 70.

The control program is stored in the storage medium 107 such as a hard disc, a compact disc, a flash memory, a flexible disc, a memory card or the like. The control program is used by installing it into the control computer 100 from the storage medium 107.

Next, the operation of the processing liquid supplying apparatus in this embodiment is explained with reference to FIGS. 4 to 8 and 10. Firstly, the shutoff valve V11 provided on the first gas supplying pipeline 58a and the shutoff valve V12 provided on the first processing liquid supplying pipeline 51a are opened based on control signals from the control section 101, so that the resist liquid L is supplied to the buffer tank 61 by the pressure of $N_2$ gas supplied to the processing liquid container 60 from the $N_2$ gas source 62.

Figure 4:
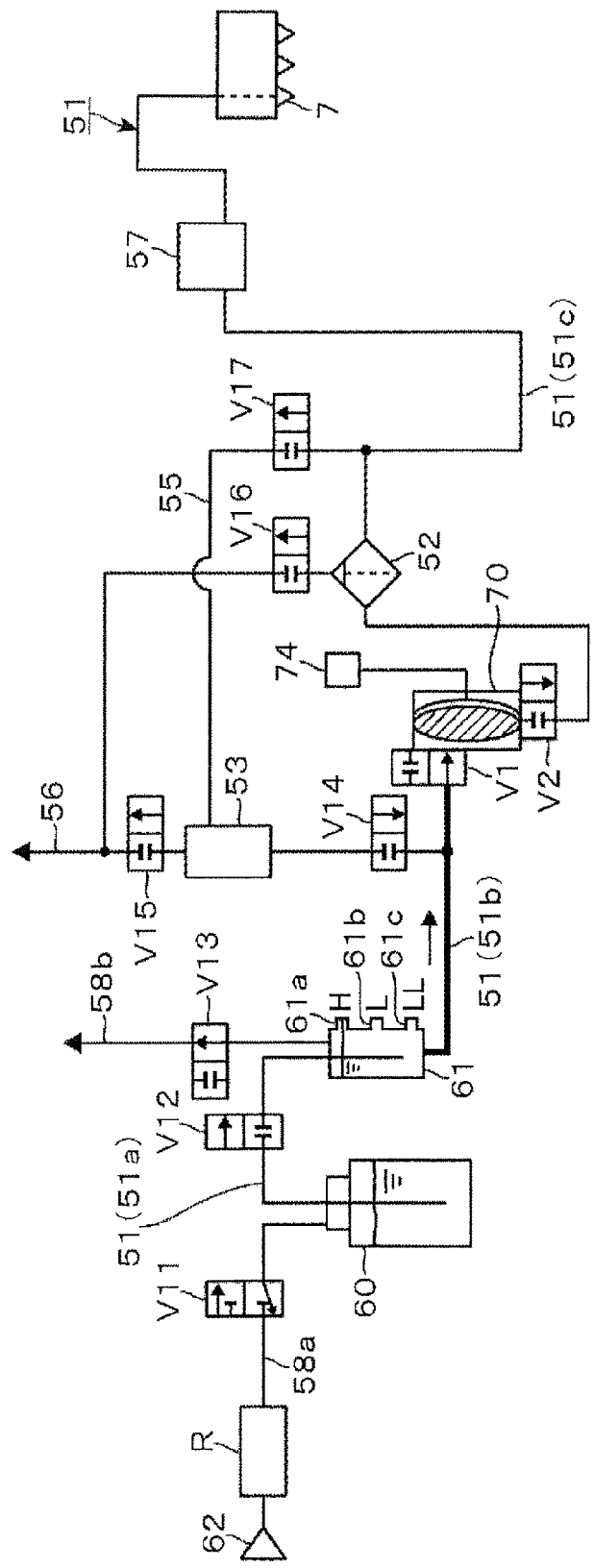
FIG. 4 is a piping diagram for explaining a pump suctioning operation in the processing liquid supplying apparatus in the first embodiment.

When the buffer tank 61 is supplied (replenished) with a predetermined amount of the resist liquid L, the upper-limit liquid level sensor 61a transmits a detection signal to the control section 101. Based on a control signal sent from the control section 101 that has received the detection signal from the upper-limit liquid level sensor 61a, the shutoff valves V11 and V12 are closed. At this time, the shutoff valve V1 is opened, and the shutoff valves V2 and V13 are closed. In addition, as shown in FIG. 4, the switching valve V4 is switched to the exhaust side. Under this condition, the pressure in the working chamber 73 of the diaphragm pump 70 is detected by the pressure sensor 79, and a detection signal indicating the detected pressure is transmitted (inputted) to the control section 101. In addition, after the switching valve V4 has been switched to the exhaust side, the shutoff valve V13 is opened.

Then, the electro-pneumatic regulator 78 is connected to the reduced-pressure source 75b so as to exhaust air in the working chamber 73. At this time, the exhausting-air flow rate is detected by the flowmeter 77, and a detection signal indicating the detected flow rate of the exhausting air is transmitted (inputted) to the control unit 101. When the air in the working chamber 73 is exhausted, as shown in FIG. 4, a predetermined amount of the resist liquid L is suctioned into the pump 70 (pump chamber 72) from the second processing liquid supplying pipeline 51b (step S1) (see FIG. 10). In the drawings for explaining this operation (e.g., FIG. 4), the resist liquid L which is now flowing is indicated by bold lines. The step S1 is performed only once when the mixing section starts the operation thereof. The flow of the resist liquid L in step S1 is similar to that in the replenishing step S4 (described later).

Figure 5:
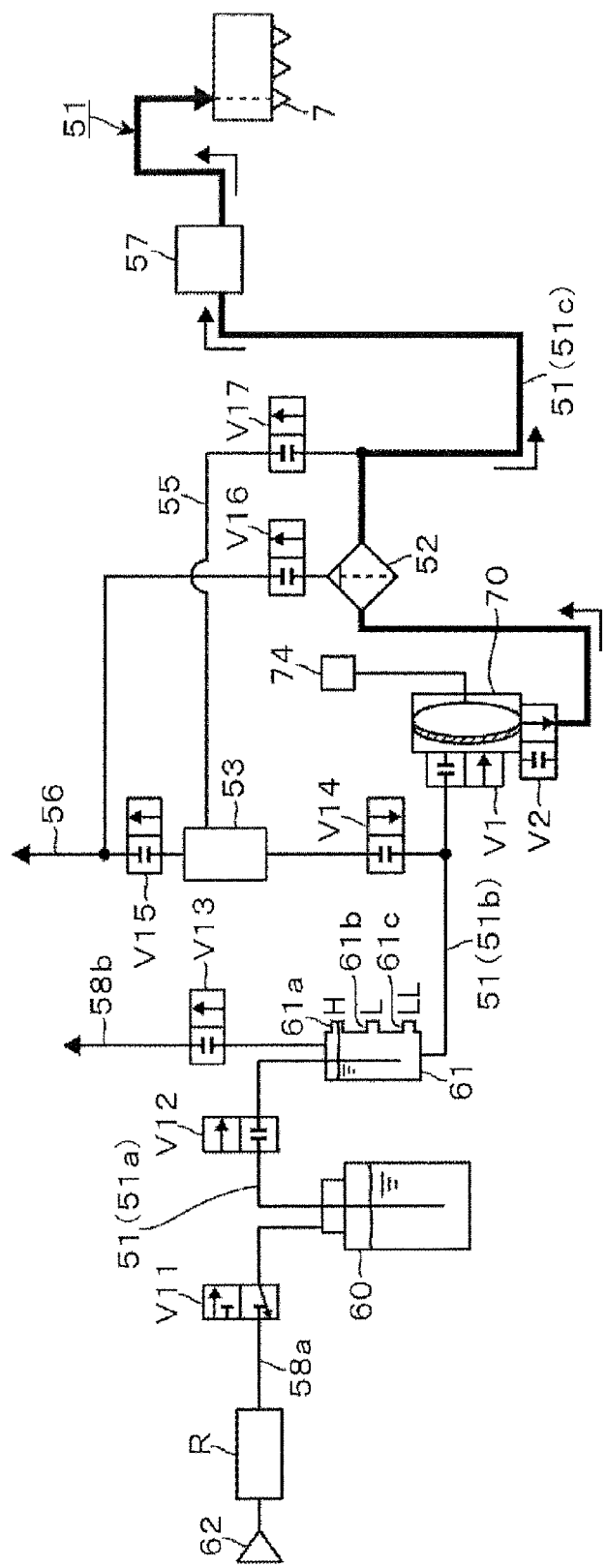
FIG. 5 is a piping diagram for explaining an ejecting step in the processing liquid supplying apparatus in the first embodiment.

Then, the shutoff valves V1 and V13 are closed, and the shutoff valve V2 and the supply control valve 57 are opened. At this time, the switching valve V4 is switched to the supply side to connect the electro-pneumatic regulator 78 to the pressure side, so that pressurized air is supplied to the working chamber 73. Thus, as shown in FIG. 5, the resist liquid L suctioned in the pump chamber 72 is pushed out, so that a part (e.g., one-fifth) of the resist liquid L having passed through the filter 52 is ejected to a wafer from the nozzle 7 (step S2). If the step S1 is the first operation of the mixing section in the step S1, the ejecting (dispensing) of the resist liquid L from the nozzle 7 in the step S2 must be a dummy dispense. However, in a steady condition where cycles of the successive steps have been performed repeatedly, the resist liquid L ejected from the nozzle 7 can be supplied to a wafer. The step S2 is referred to "ejecting step".

In this case, an amount of the resist liquid L discharged from the pump chamber 72 is controlled by controlling an amount of air supplied to the working chamber 73. Namely, if the amount of the air supplied to the working chamber 73 is small, the volume increase of the working chamber 73 is small and thus the amount of the resist liquid L to be ejected to the wafer is small. On the other hand, if the amount of the air supplied to the working chamber 73 is large, the volume increase of the working chamber 73 is large and thus the amount of the resist liquid L to be ejected to the wafer is large. In this embodiment, one-fifth of the resist liquid L suctioned into the pump chamber 72 is ejected to the wafer W. The amount of air supplied to the working chamber 73 is determined based on the data stored in the storage unit 104.

The amount of the resist liquid L to be discharged from the pump chamber 72 can be controlled not only by controlling the air flow rate but also air supply time of the air supplied to the working chamber 73. The supply of air to the working chamber 73 may be controlled using pulse signals transmitted form the control section 101.

Figure 6:
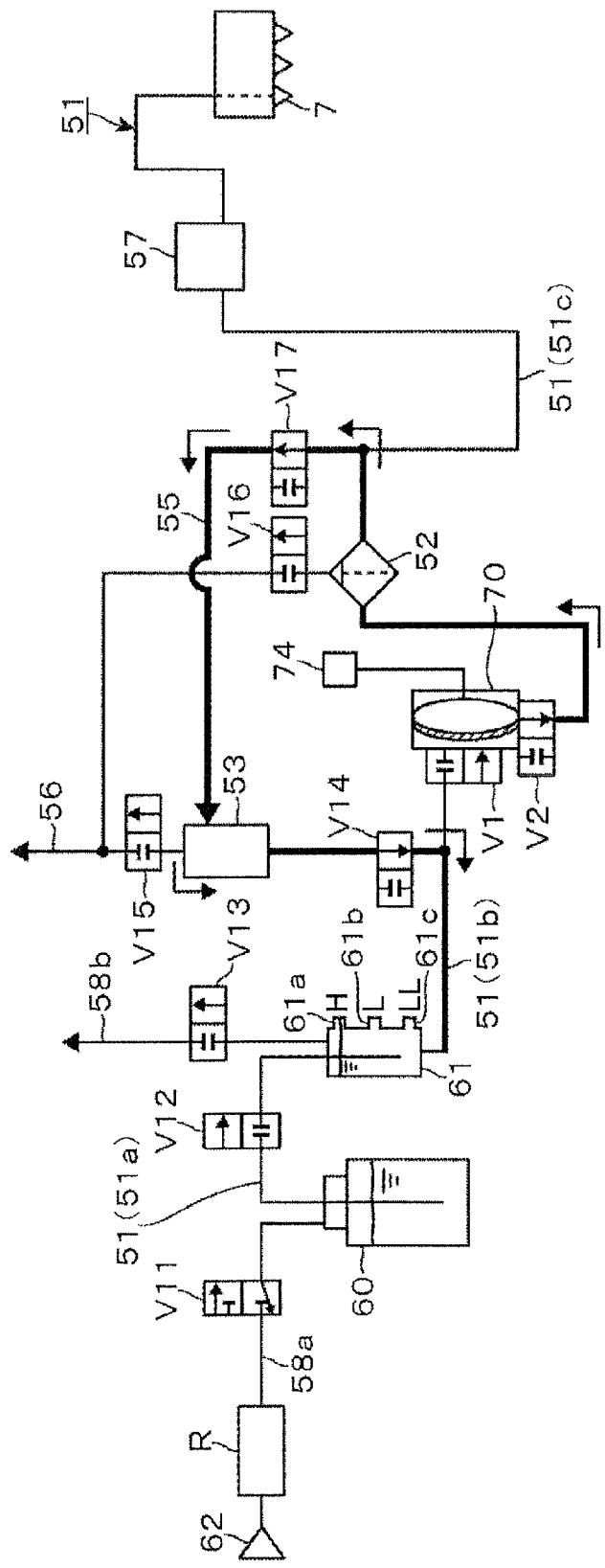
FIG. 6 is a piping diagram for explaining a returning step in the processing liquid supplying apparatus in the first embodiment.

Then, the shutoff valves V17 and V14 are opened and the amount of air supplied to the working chamber 73 is increased, so that, as shown in FIG. 6, the remaining resist liquid L having been suctioned into the pump 70 (e.g., four-fifths of the suctioned liquid L) passes through the filter 52 so as to be returned to the second processing liquid supplying pipeline 51b through the return pipeline 55 (step S3). The step S3 is referred to as "returning step". In this embodiment, four-fifths of the resist liquid L having been suctioned into the pump 70 in the step S1 is returned to the second processing liquid supplying pipeline 51b.

Figure 7:
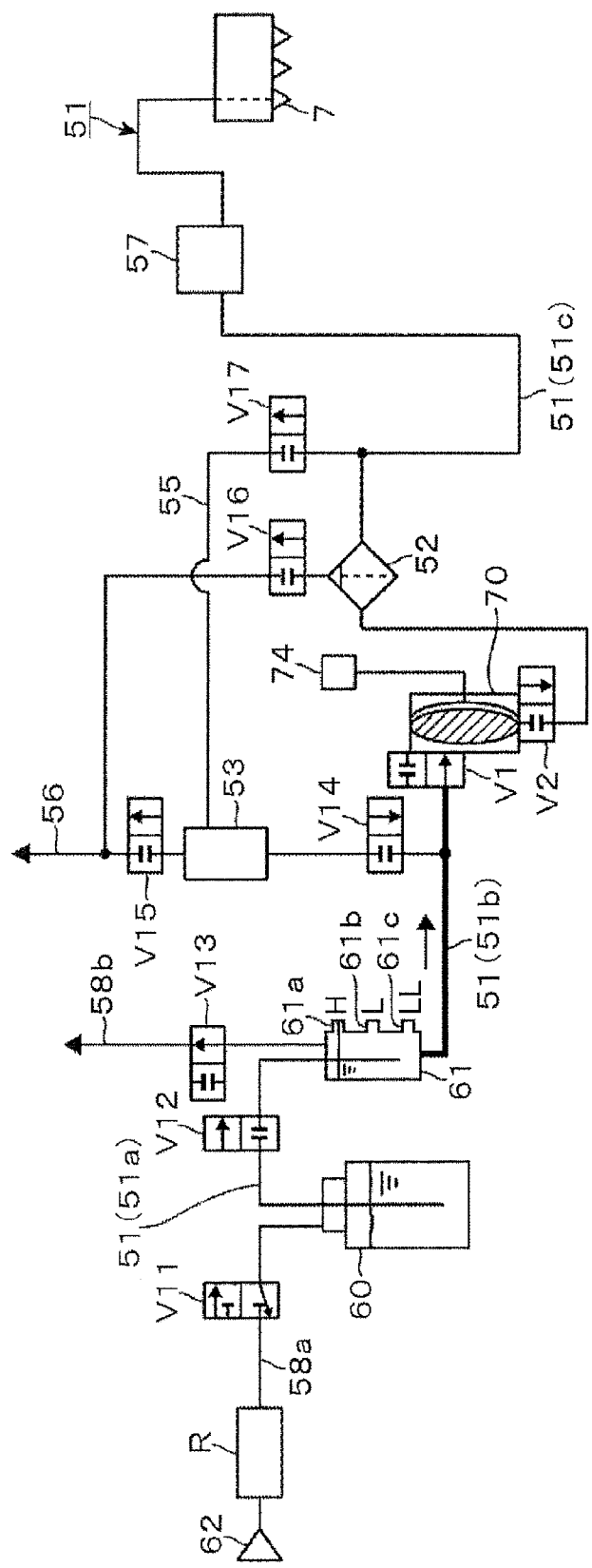
FIG. 7 is a piping diagram for explaining a replenishing step in the processing liquid supplying apparatus in the first embodiment.

Thereafter, as shown in FIG. 7, by closing the shutoff valves V2 and V14 and by opening the shutoff valves V1 and V13, the resist liquid L having been returned to the second processing liquid pipeline 51b and the resist liquid L replenished in the buffer tank 61 are mixed with each other. Returning to the step S1, the mixed resist liquid L is suctioned into the pump 70 (step S4). The step S4 is referred to as "replenishing step". At this time, the amount of the resist liquid supplied to the pump 70 from the buffer tank 61 is equal to the amount of the resist liquid ejected to the wafer W. Namely, the amount of the resist liquid L equivalent to the amount of the resist liquid L ejected to the wafer W is replenished to the pump 70. Thus, in this embodiment, an amount of the resist liquid L equivalent to the one-fifth of the amount of the resist liquid L having been suctioned into the pump 70 is discharged into the second processing liquid supplying pipeline 51b from the buffer tank 61.

The resist liquid L, which has been returned to the second processing liquid supplying pipeline 51b through the return pipeline 55, has been filtered by the filter 52, while the resist liquid R supplied from the buffer tank 61 is not filtered by the filter 52. As an indicator for indicating the filtering condition of the mixed resist liquid L, which is to be ejected to a wafer from the nozzle and which comprises the mixture of the resist liquid L which has been returned to the second processing liquid supplying pipeline 51 *b*through the return pipeline 55, and the resist liquid L which has been replenished from the buffer tank 61, a term "effective number (of the times) of filtration An" that can be calculated by the following equation (1) is defined herein.

$$An=1+(a+b)/a-b/a\times\{b/(a+b)\}^{n-1} \quad (1)$$

"An" calculated by the equation (1) is also referred to "effective number of filtration for circulated mixing filtration process". The characters "a" and "b" represents the amount of the resist liquid L ejected to the wafer, and the amount of the resist liquid L returned to the return pipeline 55. The ratio of the amount of the resist liquid L ejected to the wafer and the amount of the resist liquid L returned to the return pipeline 55 is expressed as "a:b". Namely, if the amount of the resist liquid L ejected to the wafer and the amount of the resist liquid L returned to the return pipeline 55 are represented as Va and Vb, respectively, values obtained by dividing Va and Vb by a certain constant k are "a" and "b". Herebelow, the "a" and "b" are sometimes referred to simply as "ejection amount" and "return amount".

The character "n" represents the number of times for which a step set comprising the series of steps S1 to S4 (steps S2 to S4 in or after the second cycle) are performed. In addition, the effective number of filtration "An" of the resist liquid L is a function of the ratio of the ejection amount and the return amount and the number of the filtration. From the aforementioned expression (1), the effective number of filtration "An" converges to a value of "(a+b)/a", as the number "n" (the number of times of the execution of the steps S1 to S3) increases. The relationship among "An", "n", "a", and "b" is shown in FIG. 11.

Figure 11:
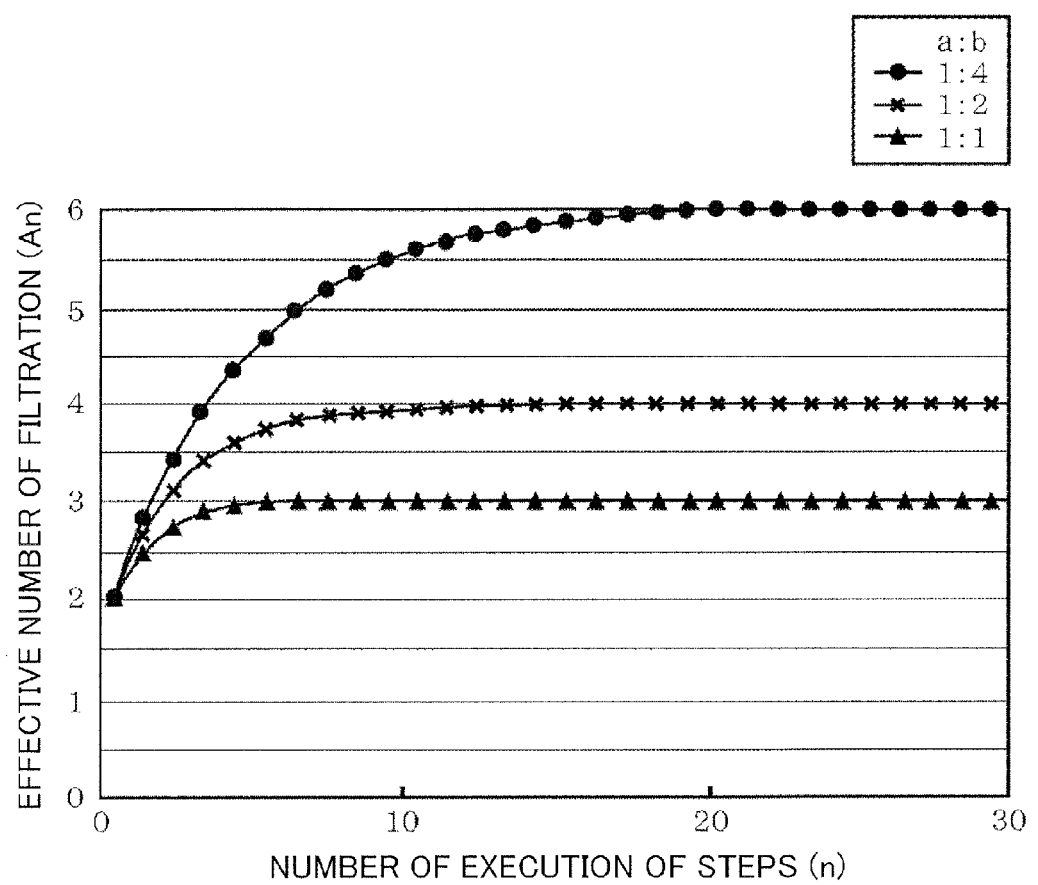
FIG. 11 is a graph showing the number of times of filtration of mixture with respect to a ratio of an amount of the processing liquid ejected to a wafer and an amount of the returned processing liquid.

As shown in FIG. 11, if "a=1" and "b=4", the effective number of filtration "An" converges to 6 (six) according to the increasing of "n". If "a=1" and "b=2", the effective number of filtration "An" converges to "4 (four)". If "a=1" and "b=2", the effective number of filtration "An" converges to "3 (three)".

In this embodiment, the ratio of the amount of the resist liquid L which is returned to the second processing liquid supplying pipeline 51*b* through the return pipeline 55 and the amount of the resist liquid L which is supplied from the buffer tank 61 is "4:1". The actual number of filtration of the resist liquid L which is returned to the second processing liquid supplying pipeline 51*b* through the return pipeline 55 is "1 (one)", while the actual number of times of filtration of the resist liquid L which is supplied from the buffer tank 61 is "0 (zero)". In this case, the effective number of filtration of the mixed resist liquid L supplied to the primary side of the filter 52 is "0.8". After the resist liquid L passes through the filter 52, the effective number of filtration of the mixed resist liquid L becomes "1.8".

By repeating the steps S2 to S4 (note that the step S1 is performed only in the first cycle as described above), the resist liquid L is suctioned into the pump 70, and a part (one-fifth) of the resist liquid L having been suctioned in the pump 70 is ejected to the wafer. Then, the remaining (four-fifths) part of the resist liquid L having been suctioned in the pump 70 is returned to the second processing liquid supplying pipeline 51*b*, the resist liquid L is replenished from the buffer tank 61. The aforementioned series of steps are repeated. For example, it is supposed that the ratio of the amount of the resist liquid ejected to the wafer W and the amount of the resist liquid returned to the second processing liquid supplying pipeline 51*b* is "1:4" (i.e., "a=1" and "b=4"). In this case, if the steps S2 to S4 are repeated five times (n=5), the effective number of filtration "A5" is "4.36".

Next, the advantageous effects of the first embodiment are explained with reference to Table 1. Table 1 describes, in the "circulating mixing filtration process" performed in a manner as described above with the use of the processing liquid supplying apparatus shown in FIG. 3, the relationship among the ejection amount, the return amount and the number of times for which the steps 2 to 4 are performed. Further, Table 1 describes the cycle time and the normalized number of particles. In addition, for the purpose of comparison, Table 1 describes parameter values obtained by performing a process where the resist liquid L, which has been passed through the filter 52 only one time without performing the returning step, is ejected to a wafer (one filtration). In this case, the effective number of filtration can be deemed to be "1 (one)". In the case of the circulated mixture, the cycle time means the time required for performing the steps S2 to S4 each for "n-times". On the other hand, in the case of the one filtration, the cycle time means the time required for performing the steps S1 and S2. Table 1 further describes the parameter values obtained when the "circulating/reciprocating mixing filtration process" (described later in the second embodiment) is performed. The evaluation therefor is described in the second embodiment described later.

TABLE 1

|  | Filtering Times | Eject Amount (ml) | Return Amount (ml) | Cycle Time (sec) | Normalized Particle Number (NPN) | NPN Ratio VS Filtered Once |
|---|---|---|---|---|---|---|
| Not Filtered | 0 | 0.5 | 0 | — | 100 | — |
| Filtered Once | 1 | 0.5 | 0 | 25.5 | 22 | 100 |
| Circulating Mixing Filtration | 5 | 0.5 | 2.0 | 24.9 | 17 | 77 |
| Circulating Mixing Filtration | 10 | 0.5 | 4.5 | 35.9 | 7 | 32 |
| Circulating Reciprocating Mixing Filtration | 5 | 0.5 | 1.0 | 20.5 | 18 | 82 |
| Circulating Reciprocating Mixing Filtration | 10 | 0.5 | 2.3 | 26.0 | 8 | 36 |

In the circulating mixing filtration process where "n=5" ("n" is the total number of times of the execution of Steps S2 to S4), the cycle time was 24.9 seconds, the normalized number of particles was "17", and the normalized number of particles relative to one filtration was "77". Namely, in the circulating mixing filtration process where "n=5", the cycle time, which was substantially the same as the cycle time required for performing the one filtration, could be achieved. As compared with the non-filtered resist liquid, the number of particles could be reduced to 17%. As compared with the resist liquid L that was filtered only once, the number of particles could be reduced to 77%.

In the circulating mixing filtration process where "n=10", the cycle time was 35.9 seconds, the normalized number of particles was 7, and the normalized number of particles relative to one filtration was "32". Namely, in the circulating mixing filtration process where "n=10", the number of particles could be reduced to 7% as compared with the non-filtered resist liquid. The number of particles could be reduced to 32% as compared with the resist liquid L that was filtered once. In addition, as compared with the circulating mixing filtration process where "n=5", the number of particles could be reduced to 41%.

Thus, the filtration efficiency can be improved while maintaining the throughput as in the case where the resist liquid is filtered only once by the filter. As a result, without significantly changing the configuration of the apparatus, a high filtration efficiency (capturing efficiency of foreign matters) can be achieved by only one filter device while suppressing the throughput reduction, similar to the case where a plurality of filters are uses.

Figure 8:
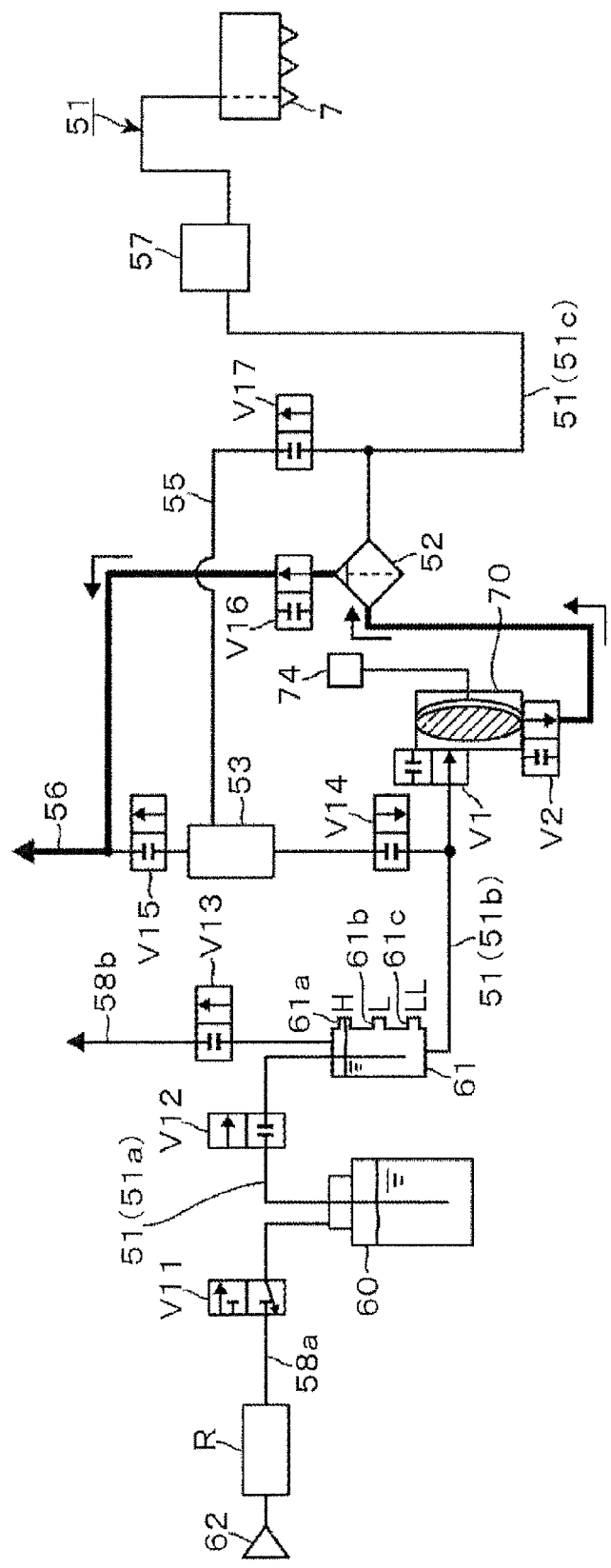
FIG. 8 is a piping diagram for explaining an operation for removing bubbles of a filter in the processing liquid supplying apparatus in the first embodiment.

When bubbles are collected in the filter 52 in the course of the execution of the liquid process to plural wafers, a process of removing bubbles of the filter 52 is performed. For example, when the amount of the resist liquid having passed through the filter 52 reaches a predetermined amount (e.g., 500 ml), a predetermined amount (e.g., 1 ml) of the resist liquid L is supplied to the pump 70. Then, the shutoff valves V2 and V16 are opened, and as shown in FIG. 8, the resist liquid L is supplied to the filter 52 by driving the pump 70. The resist liquid L having passed through the filter 52 flows into the drain pipeline 56. Thus, the bubbles trapped by the filter 52 are discharged, together with the resist liquid L, from the drain pipeline 56.

Figure 12:
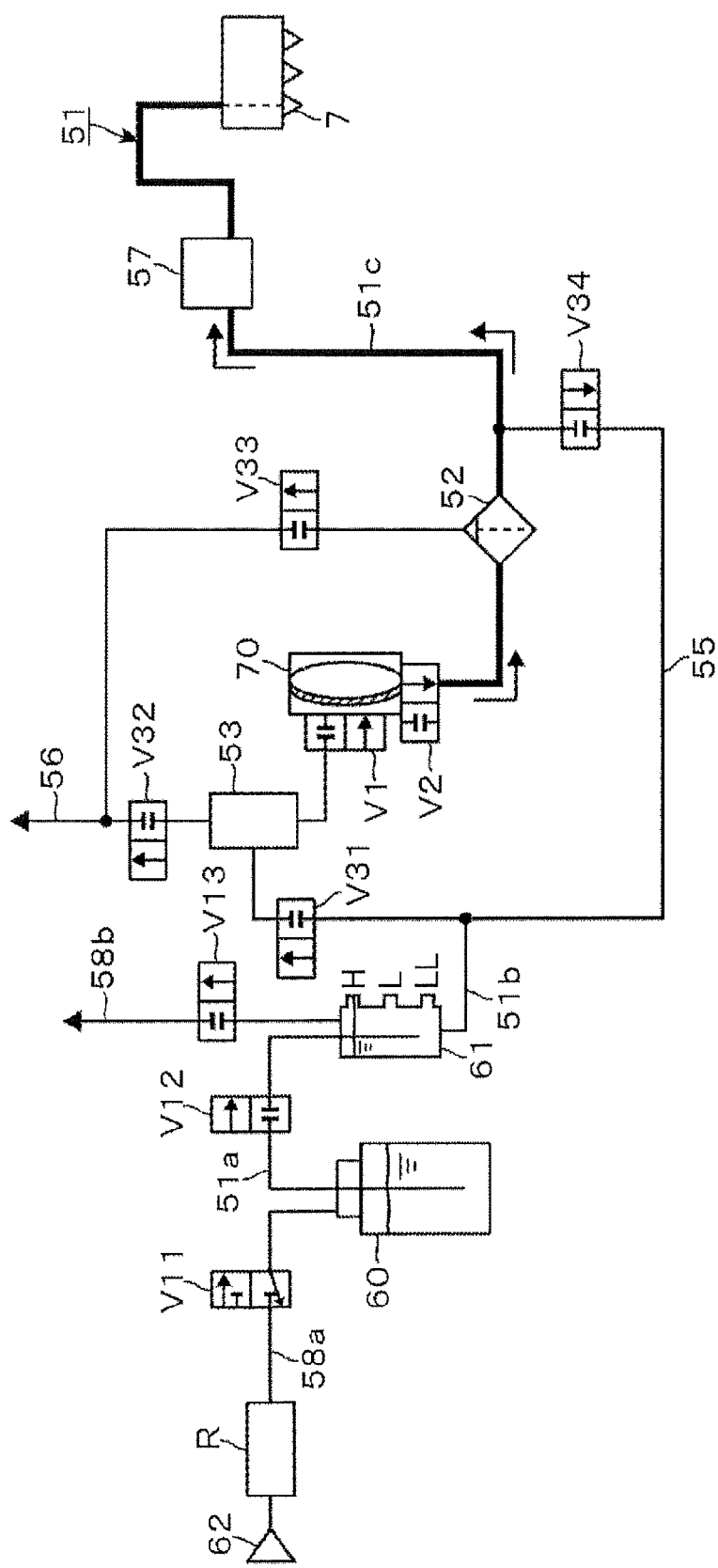
FIG. 12 is a piping diagram for explaining an ejecting step in the processing liquid supplying apparatus in another variation of the first embodiment.
Figure 13:
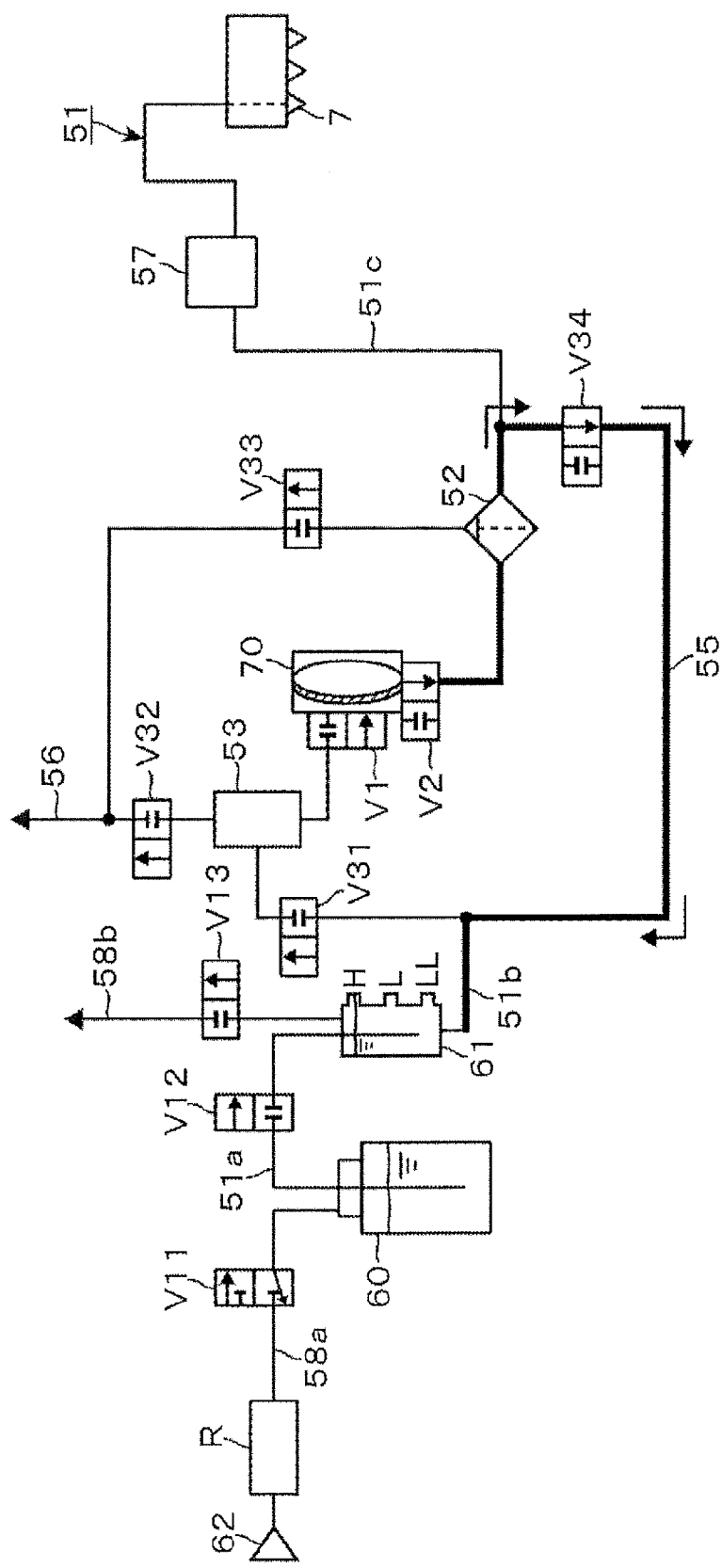
FIG. 13 is a piping diagram for explaining a returning step in the processing liquid supplying apparatus in another variation of the first embodiment.
Figure 14:
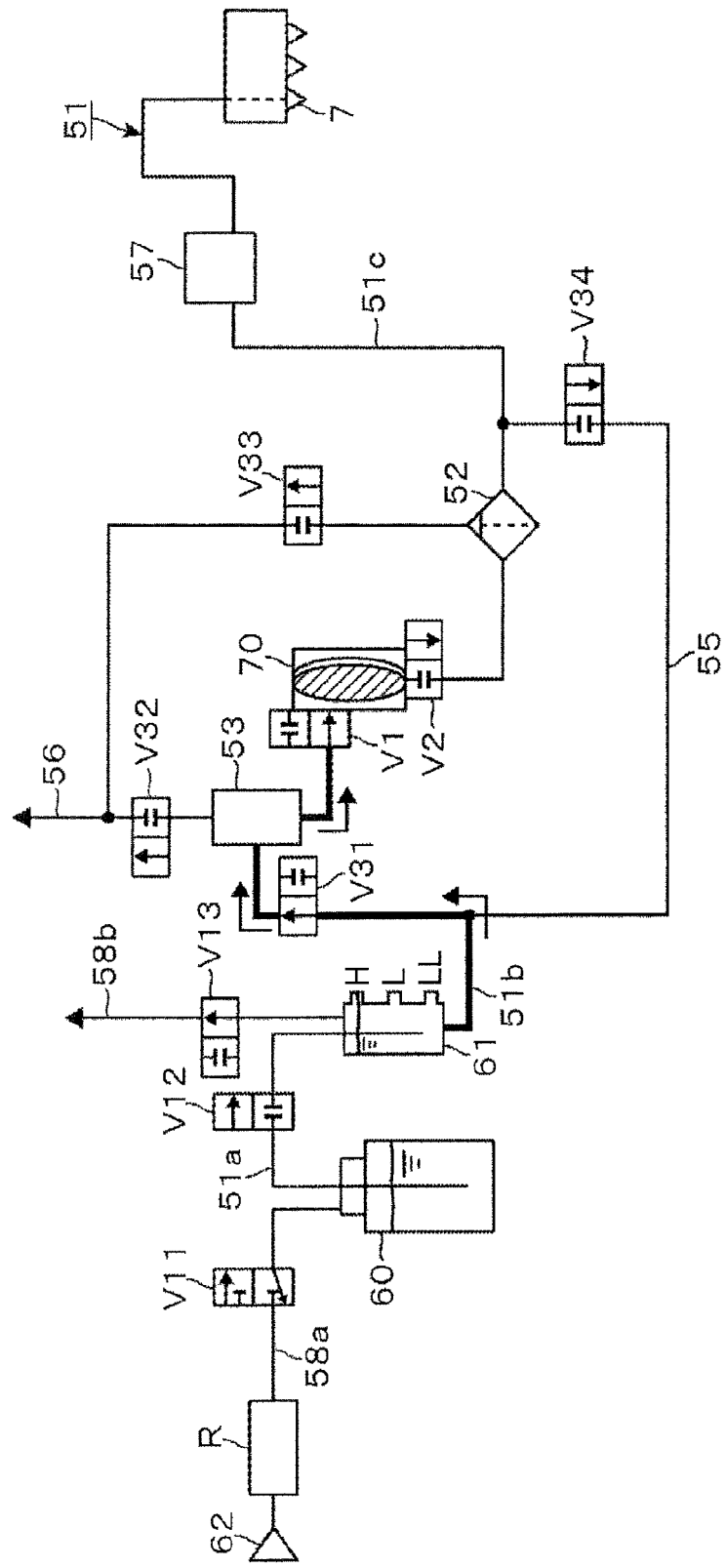
FIG. 14 is a piping diagram for explaining a replenishing step in the processing liquid supplying apparatus in another variation of the first embodiment.

FIGS. 12 to 14 show the processing liquid supplying apparatus in another variation of the first embodiment. In the aforementioned variation, the trap tank 53 is provided on the return passage 55. Meanwhile, in this variation, the trap tank 53 is provided on the second processing liquid supplying path 51b. In this variation, the same elements as those of the previously-described variation of the first embodiment are designated by the same reference signs, and detailed description thereof is omitted.

In this variation of the first embodiment, as shown in FIG. 12, after a part of the resist liquid L in the pump 70 has been ejected to a wafer (step S2), the resist liquid L is returned to the first processing liquid supplying pipeline 51b by the pump 70 (step S3), with the shutoff valve V34 being opened, as shown in FIG. 13. Then, as shown in FIG. 14, the shutoff valves V1, V31 and V13 are opened, an amount of the resist liquid L equivalent to the amount of the resist liquid L ejected to the wafer is replenished to the second processing liquid supply pipeline 51b from the buffer tank 61, and the resist liquid L mixed in the second processing liquid supplying pipeline 51B is suctioned by the pump 70 (step S4). Also in this variation, the resist liquid L passes through the filter 52 in the returning step (step S3), and further passes through the filter 52 in the ejecting step (S2) in which the resist liquid L is fed toward the nozzle 7 from the pump 70.

Figure 15:
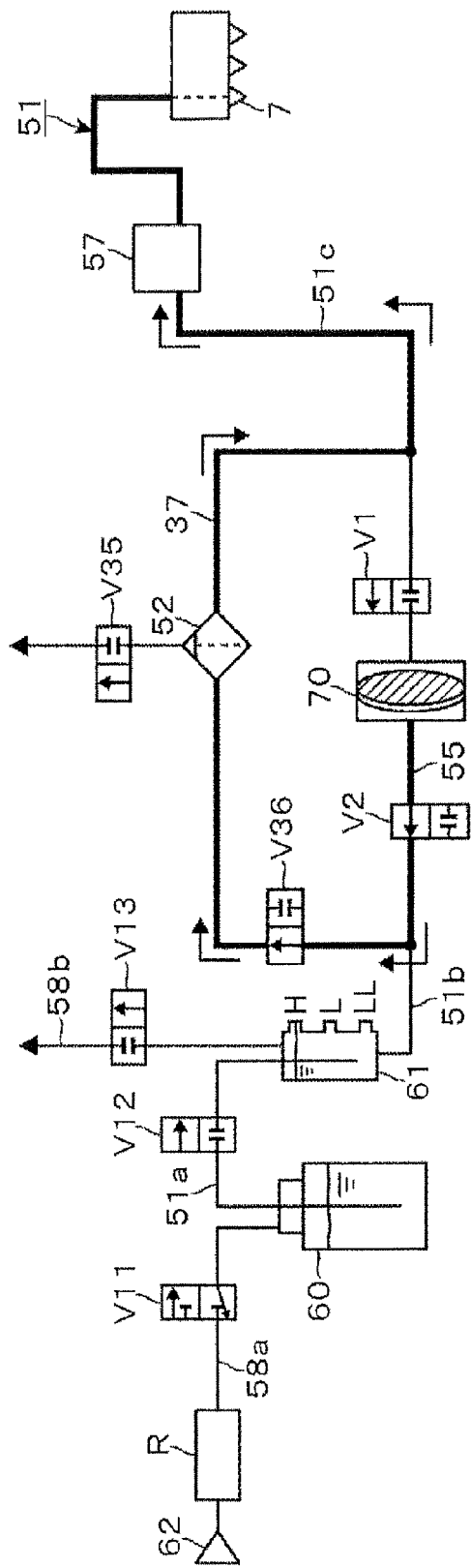
FIG. 15 is a piping diagram for explaining an ejecting step in the processing liquid supplying apparatus in yet another variation of the first embodiment.
Figure 16:
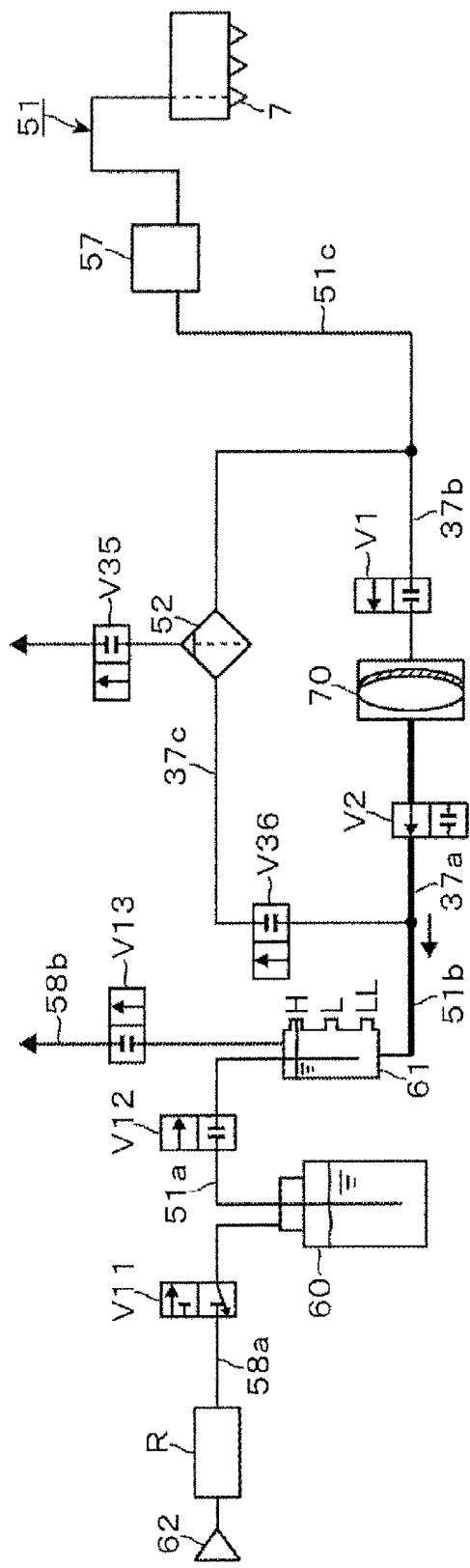
FIG. 16 is a piping diagram for explaining a returning step in the processing liquid supplying apparatus in yet another variation of the first embodiment.
Figure 17:
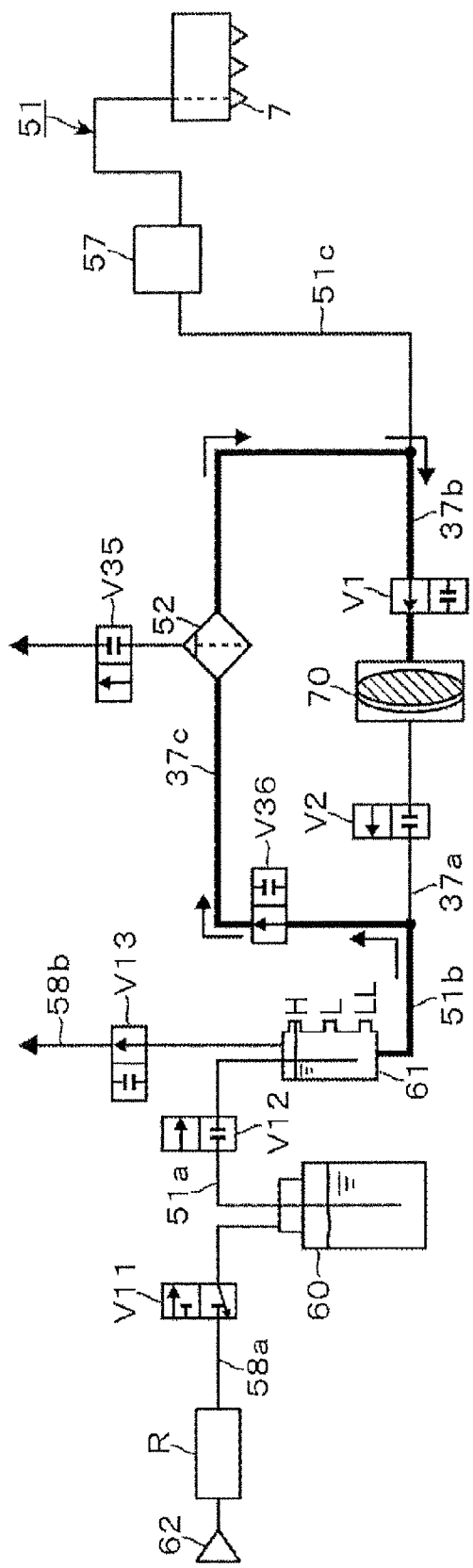
FIG. 17 is a piping diagram for explaining a replenishing step in the processing liquid supplying apparatus in yet another variation of the first embodiment.
Figure 18:
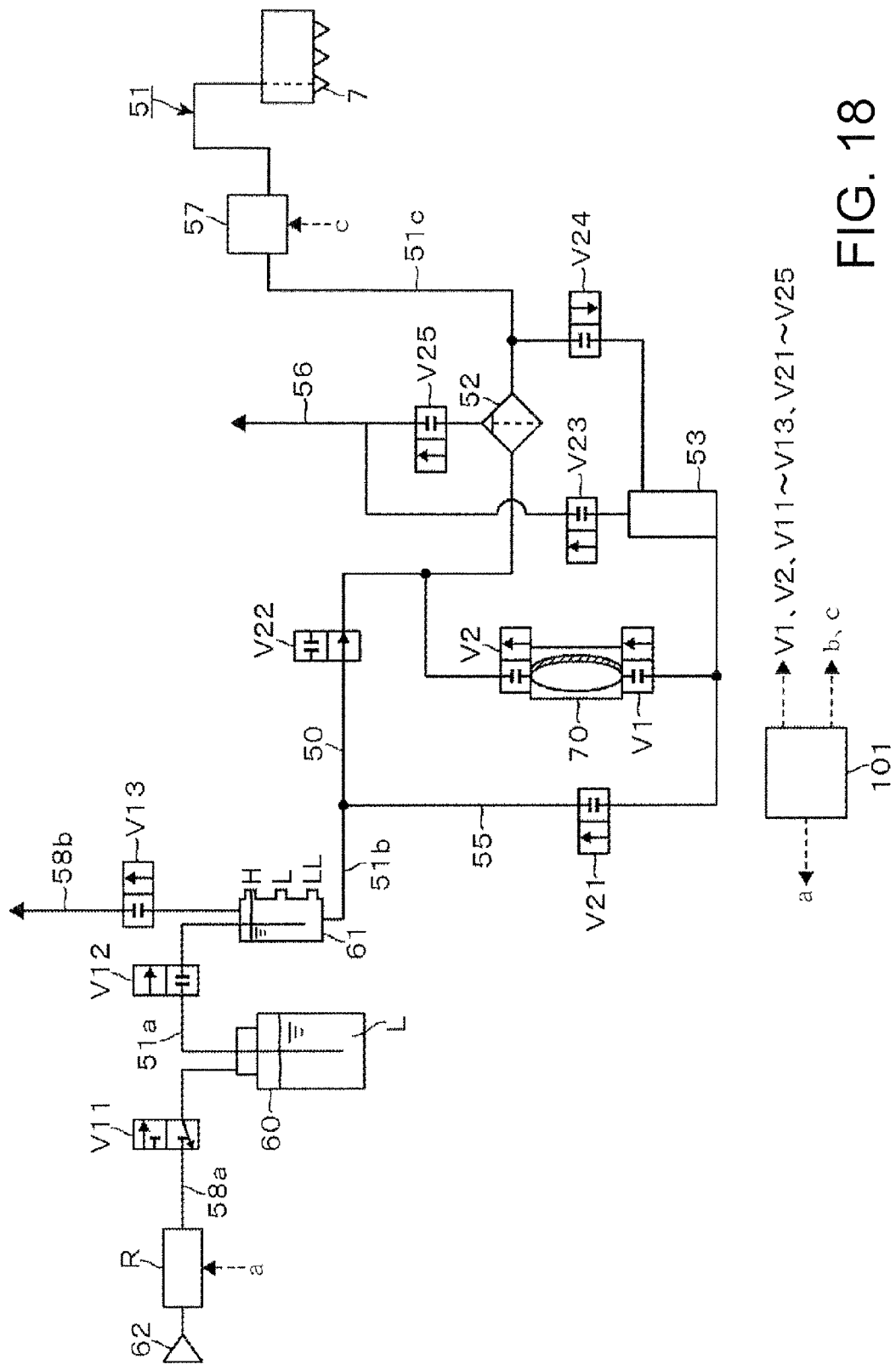
FIG. 18 is a piping diagram showing the structure of a second embodiment of the processing liquid supplying apparatus.

The processing liquid supplying apparatus in yet another variation of the first embodiment is explained. As shown in FIGS. 15 to 17, in the processing liquid supplying apparatus, a looped passage 37 is connected to the downstream of the second processing liquid supplying pipeline 51b. The looped passage 37 is provided with the shutoff valve V36, the filter 52, the shutoff valve V1, the pump 70 and the shutoff valve V2, which are arranged in this order from the connecting point between the looped passage 37 and the second processing liquid supplying pipeline 51b along a direction in which the resist liquid flows. The shutoff valve V1 is positioned on the primary side of the pump 70. Since the resist liquid L ejected from the pump 70 returns thereto through the looped passage 37, the looped passage 37 can be regarded as a circulation passage. In addition, the third processing liquid supplying pipeline 51c is branched from the looped passage 37 between the filter 52 and the pump 70.

The operation of the processing liquid supplying apparatus is explained. In the former two variations, the resist liquid L passes through the filter 52 in the ejecting step S2, and the resist liquid L further passes through the filter 52 in the returning step S3. Meanwhile, in this variation, in addition to the ejecting step S2, the resist liquid L passes through the filter 52 in the replenishing step S4 instead of the returning step S3. The operation is explained in more detail. The operation for sucking the resist liquid L to the pump 70 (step S1) is explained. Firstly, the pump 70 is activated with the shutoff valve V2 being closed while the shutoff valves V36 and V1 being opened. The resist liquid L flows toward the filter 52 from the buffer tank 61 through the second processing liquid supplying pipeline 51b and the looped passage 37. After the resist liquid L has passed through the filter 52, the resist liquid L is supplied to the pump 70 through the looped passage 37. If this step is the first operation of the mixing section, the resist liquid L is not mixed with the resist liquid L having once passed through the filter, unlike in the below described replenishing step S4. However, the flow of the resist liquid L is similar to that in step S4 (described later) as shown in FIG. 17.

Then, in order to perform the ejecting step (step S2) shown in FIG. 15 in which the resist liquid L is supplied to the nozzle 7 from the pump 70, the shutoff valves V2a and V36 and the supply control valve 57 are opened. The resist liquid supplied from the pump 70 is supplied to the filter 52 through the looped passage 37a and the looped passage 37c. Then, the resist liquid L having passed through the filter 52 flows into the third processing liquid supplying pipeline 51c so as to be ejected from the nozzle 7. At this time, one-fifth of the amount of the resist liquid L (e.g., 1 ml) existing in the pump 70 is discharged. As previously described, when the cleanliness of the resist liquid becomes stable by repeating the series of steps, i.e., when the effective number of filtration converges to the upper limit value, the regular dispense (not the dummy dispense), by which the resist liquid L is ejected from the nozzle 7 to the wafer, is performed.

Following thereto, as shown in FIG. 16, there is performed the returning step (step S3) in which the resist liquid L remaining in the pump 70 is returned to the second processing liquid supplying pipeline 51b. At this time, the shutoff valve V36 and the supply control valve 57 are closed, and the shutoff valve V2 is opened. Under this state, the remaining resist liquid L (i.e., four-fifths of the resist liquid L (e.g., 4 ml) having been charged in the pump 70) is pushed out from the pump 70 so as to be returned to the second processing liquid supplying pipeline 51b.

Thereafter, the step S4 as the replenishing step is performed. In the step S4, as shown in FIG. 17, the shutoff valve V2 is closed, and the shutoff valves V36, V1 and V13 are opened. The resist liquid L is replenished to the second processing liquid supplying pipeline 51b from the buffer tank 61. Thus, the resist liquid L that has been returned to the second processing liquid supplying pipeline 51b from the pump 70 in the step S3, and the newly replenished resist liquid L are mixed with each other, and the mixed resist liquid L is supplied to the pump 70. The resist liquid L in the second processing liquid supplying pipeline 51b is suctioned into the pump 70 through the second processing liquid supplying pipeline 51b, the looped passage 37c, the filter 52 and the looped passage 37b. Since the resist liquid L is suctioned by the pump 70, the resist liquid L is replenished to the buffer tank 61 from the processing liquid container 60.

Thus, in this variation, the resist liquid L passes through the filter 52 in the ejecting step (step S2) in which the resist liquid L in the pump 70 is discharged toward the nozzle 7, and in the replenishing step (step S4) in which the resist liquid L remaining in the pump 70 and the resist liquid L replenished from the buffer tank 61 are suctioned into the pump 70 after the ejecting step (step S2). In the returning step (step S3) in which the resist liquid L remaining in the pump 70 is returned to the second processing liquid supplying pipeline 51b, the resist liquid L does not pass through the filter 52. Namely, in this variation, unlike the former two variations, the resist liquid L passes through the filter 52 not in the returning step S3 but in the replenishing step S4.

In this variation, when the resist liquid L is returned to the second processing liquid supplying pipeline 51b from the pump 70, the resist liquid L does not pass through the filter 52. However, the returned resist liquid L is mixed with resist liquid L replenished from the buffer tank 61, then passes through the filter 52, and is supplied to the pump 70. That is, the resist liquid L remaining in the pump 70 is returned to the second processing liquid supplying pipeline 51b from the pump 70 without passing through the filter 52, then passes through the filter 52 before the resist liquid L is supplied to the pump 70. Thus, the number of times for which the resist liquid L passes through the filter 52 can be increased, whereby the same advantageous effects can be achieved.

<Second Embodiment>

Next, a second embodiment of the processing liquid supplying apparatus according to the present invention will be explained with reference to FIGS. 18 to 21. In the first embodiment, the resist liquid L passes through the filter 52 in the returning step S3 or the replenishing step S4, in addition to the ejecting step S2. On the other hand, in the second embodiment, the resist liquid passes through the filter both in the returning step S3 and the replenishing step S4. In the second embodiment, the same elements as those of the first embodiment are designated by the same reference signs, and detailed description thereof is omitted.

The processing liquid supplying apparatus in the second embodiment includes a return pipeline 55 extending from the pump 70 top the second processing liquid supplying pipeline 51b. The return pipeline 55 is provided with a filter 52, an shutoff valve V24, a trap tank 53 and an shutoff valve V21, which are arranged in this order from the side of the shutoff valve V2 along a direction in which a resist liquid L flows. A replenishing passage 50 extends from a buffer tank 61 to the pump 70. The replenishing passage 50 is provided with an shutoff valve 22, the filter 52, the shutoff valve 24 and the trap tank 53, which are arranged in this order from the side of the buffer tank 61 along the direction where the resist liquid L flows. The replenishing passage 50 is connected to the side of the shutoff valve V1 of the pump 70. A part of the return pipeline 55 is shared by the replenishing passage 50.

A third processing liquid supplying pipeline is branched from the part of the fluid circuit, which is commonly owned by the return pipeline 55 and the replenishing passage 50, on the secondary side of the filter 52 and the primary side of the shutoff valve V24. In this variation, a part of the fluid circuit extending from a joint between the replenishing passage 50 and the return pipeline 55 on the primary side of the shutoff valve V22 to the pump 70, a part the fluid circuit extending from the pump 70 a joint between the return pipeline 55 and the replenishing passage 50 on the secondary side of the shutoff valve V21, and devices such as the pump 70 constitute the mixing section.

Figure 19:
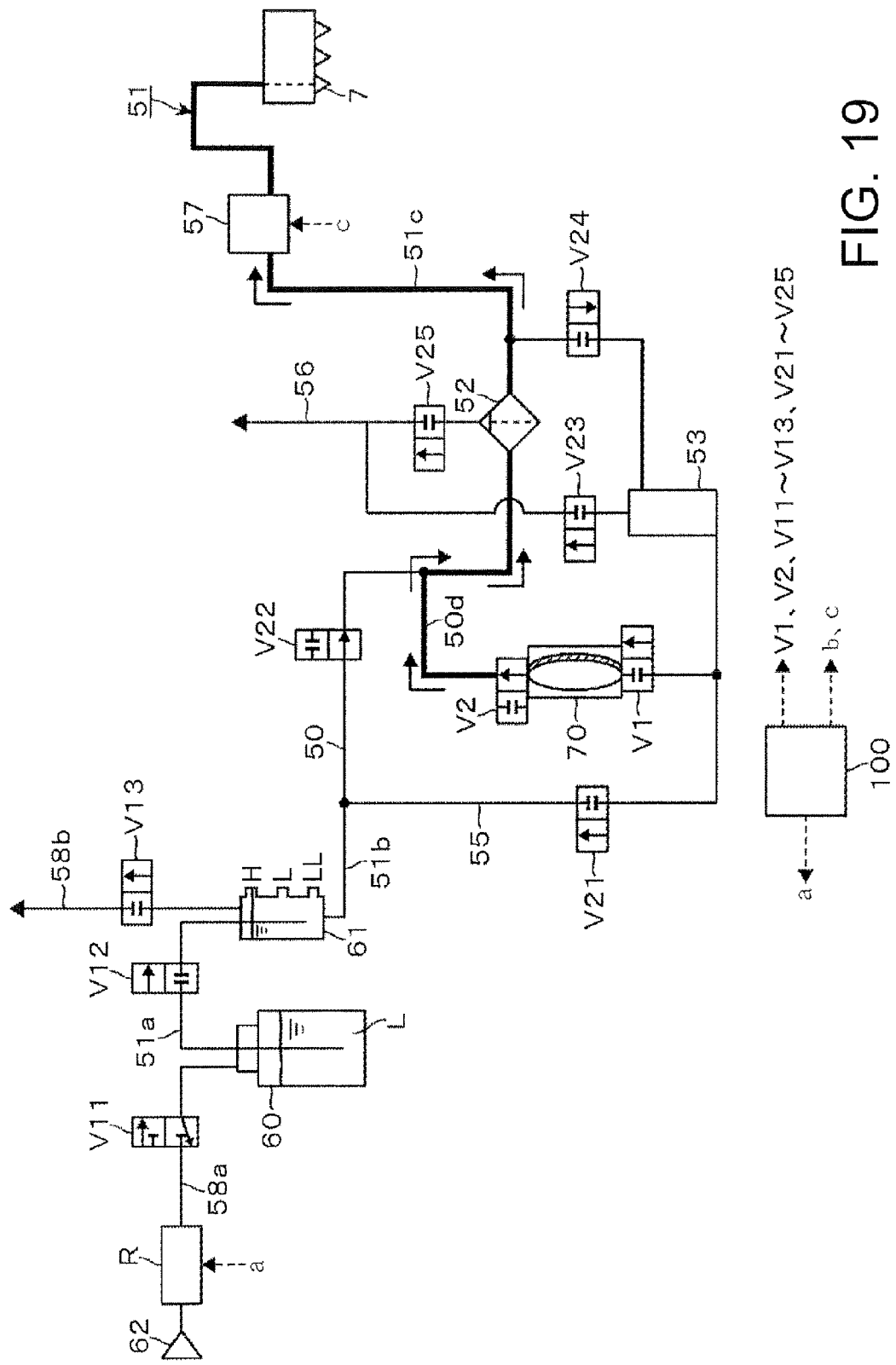
FIG. 19 is a piping diagram for explaining an ejecting step in the processing liquid supplying apparatus in the second embodiment.

The operation of the second embodiment is explained. Firstly, the resist liquid L is suctioned into the pump 70 by the pump 70 (step S1). At this time, the shutoff valves V22, V24 and V1 are opened. The resist liquid L is fed to the filter 52 from the buffer tank 61 through the second processing liquid supplying pipeline 51b and the replenishing passage 50. After the resist liquid L has passed through the filter 52, the resist liquid L is suctioned into the pump 70 through the trap tank 53 (step S1). Also in this variation, the explanation is made assuming that the step S1 is the first operation of the mixing section. Then, the shutoff valves V1 and V22 are closed, and the shutoff valves V2 and the supply control valve 57 are opened. By driving the pump 70, as shown in FIG. 19, a part of the resist liquid L (e.g., 1 ml) existing in the pump 70 is pushed out, and the resist liquid L passes through filter 52 so as to be ejected to a wafer through the nozzle 7 (step S2). The step S2 is referred to as "ejecting step".

Figure 20:
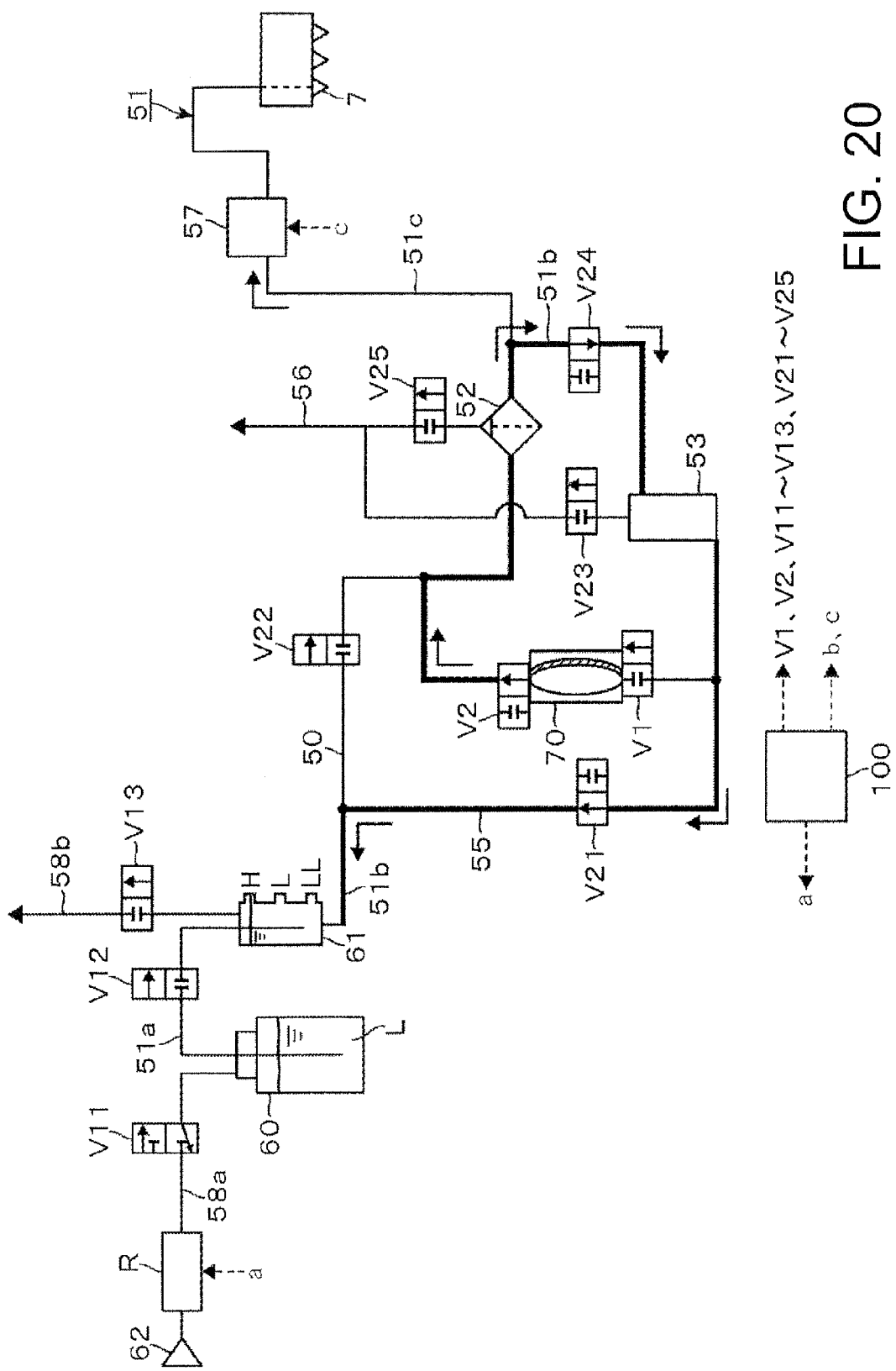
FIG. 20 is a piping diagram for explaining a returning step in the processing liquid supplying apparatus in the second embodiment.

In a returning step (step S3) in which the resist liquid L remaining in the pump 70 is returned to the second processing liquid supplying pipeline 51b, as shown in FIG. 20, the supply control valve 57 is closed, and the shutoff valves V24 and V34 are opened, so that the remaining resist liquid L is returned to the second processing liquid supplying pipeline 51b through the return pipeline 55. At this time, the resist liquid L pushed out from the pump 70 passes through the filter 52 and the trap tank 53, and is then returned to the second processing liquid supply pipeline 51b.

Figure 21:
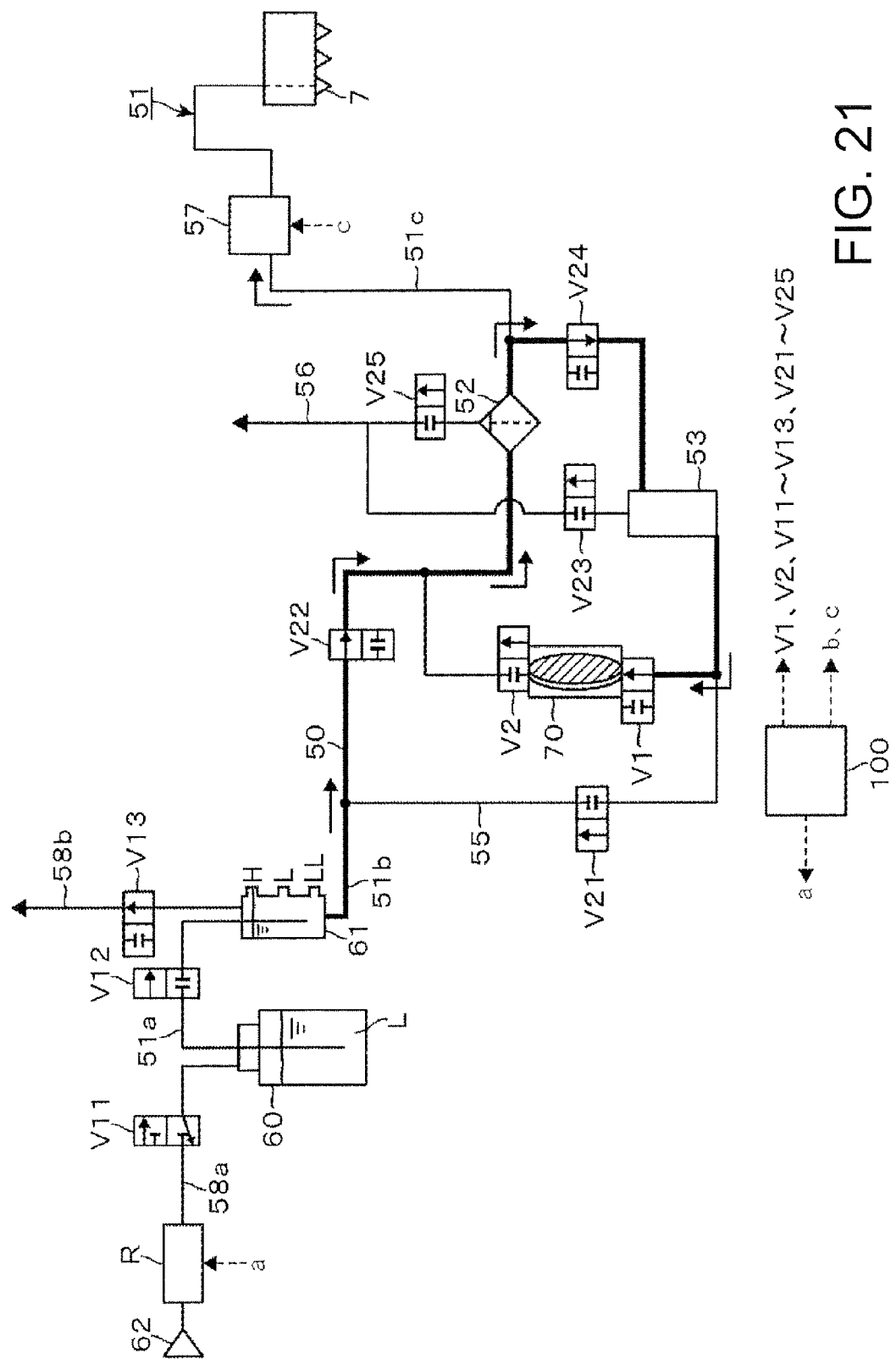
FIG. 21 is a piping diagram for explaining a replenishing step in the processing liquid supplying apparatus in the second embodiment.

Subsequently, the resist liquid L returned to the second processing liquid supplying pipeline 51b and the resist liquid L replenished from the buffer tank are mixed with each other, and the mixed processing liquid L is supplied to the pump (step S1). At this time, as shown in FIG. 21, the shutoff valve V21 is closed, and the shutoff valves V22, V24, V1 and V13 are opened. Then, an amount of the resist liquid L equivalent to the resist liquid L ejected to the wafer W is replenished to the second processing liquid supplying pipeline 51b from the buffer tank 61. Thus, the resist liquid L replenished from the buffer tank 61, and the resist liquid L returned to the second processing liquid supplying pipeline 51b are mixed with each other. The mixed resist liquid L is suctioned into the pump chamber 72. At this time, the resist liquid L in the second processing liquid supplying pipeline 51b is supplied to the pump 70 through the filter 52 and the trap tank 53.

In this variation, the resist liquid L passes through the filter 52 when the resist liquid L is ejected to the wafer (step S2), when the resist liquid L remaining in the pump 70 is returned to the second processing liquid supply pipeline 51b (step S3), and when the resist liquid L returned to the second processing liquid supplying pipeline 51b and the resist liquid L supplied from the buffer tank 61 are mixed, and then the mixed processing liquid L is suctioned into the pump (step S1).

Thus, in the second embodiment of the processing liquid supplying apparatus, a part of the resist liquid L suctioned into the pump 70 is filtered by the filter 52 in a step where the resist liquid L is passed through the first return pipeline 65a and the second processing liquid supplying pipeline 51b, i.e., in a step where the resist liquid L is reciprocated in the second processing liquid supplying pipeline 51b (hereinafter referred to as "circulating/reciprocating mixing filtration process"). The relationship among the effective number of "An" of the resist liquid L to be ejected to the wafer, the amount of the resist liquid L suctioned in the pump 70 ejected to the wafer, and the amount of the resist liquid L returned to the processing liquid supplying pipeline 51b is shown by the following expression (2).

$$An=1+(a+2b)/a-2b/a\times\{b/(a+b)\}^{n-1} \qquad (2)$$

The effective number of filtration represented by the expression (2) is referred to as "effective number of filtration for circulating/reciprocating filtration process".

For example, the ratio of an amount of the resist liquid ejected to the wafer and an amount of the resist liquid returned to the processing liquid supplying pipeline 51b is "1:4", that is, "a=1" and "b=4". In this case, when the steps S2 to S4 are repeated five times (n=5), the effective number of filtration "A5" is "6.72" according to the above expression (2).

Figure 22:
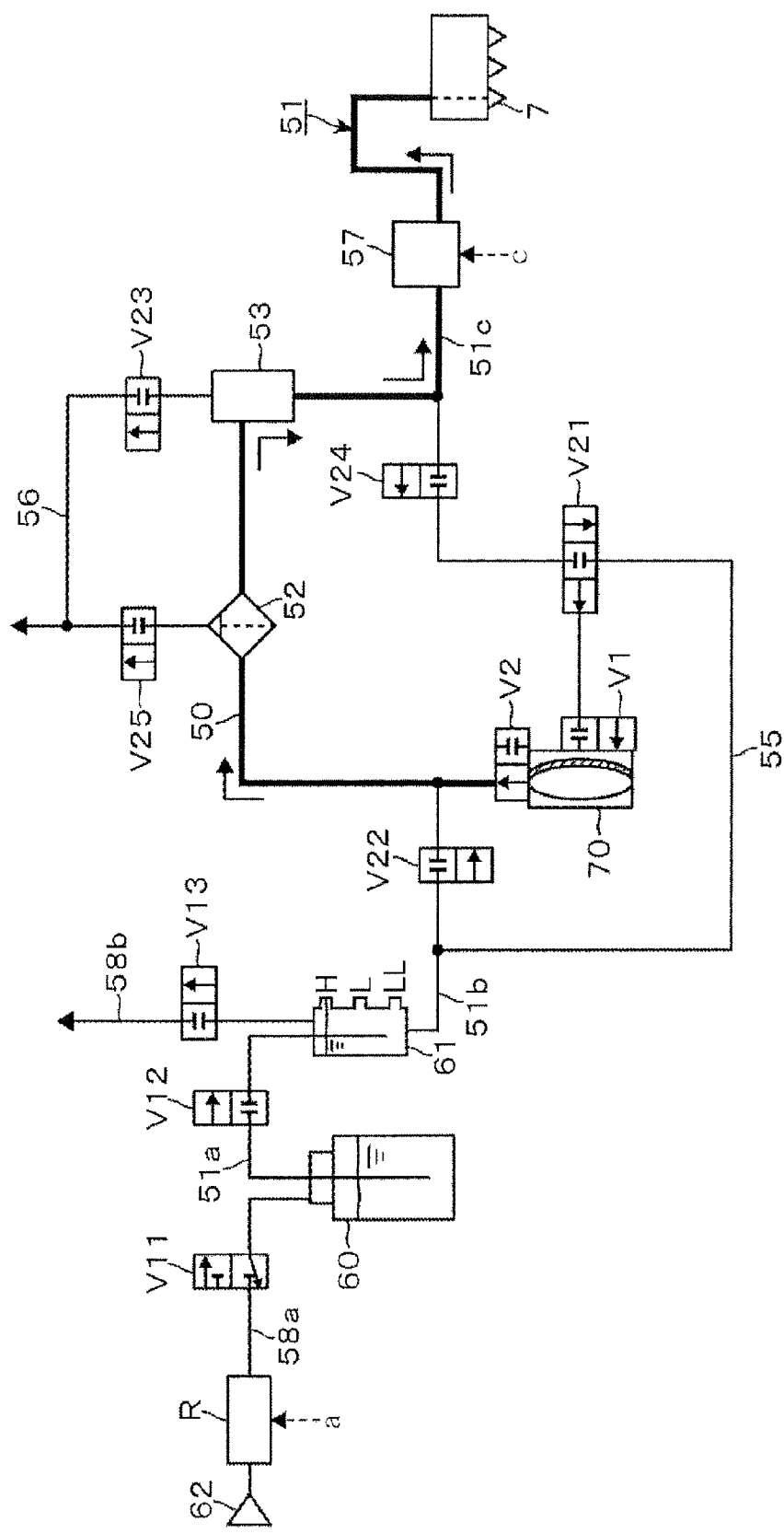
FIG. 22 is a piping diagram for explaining an ejecting step in the processing liquid supplying apparatus in another variation of the second embodiment.
Figure 23:
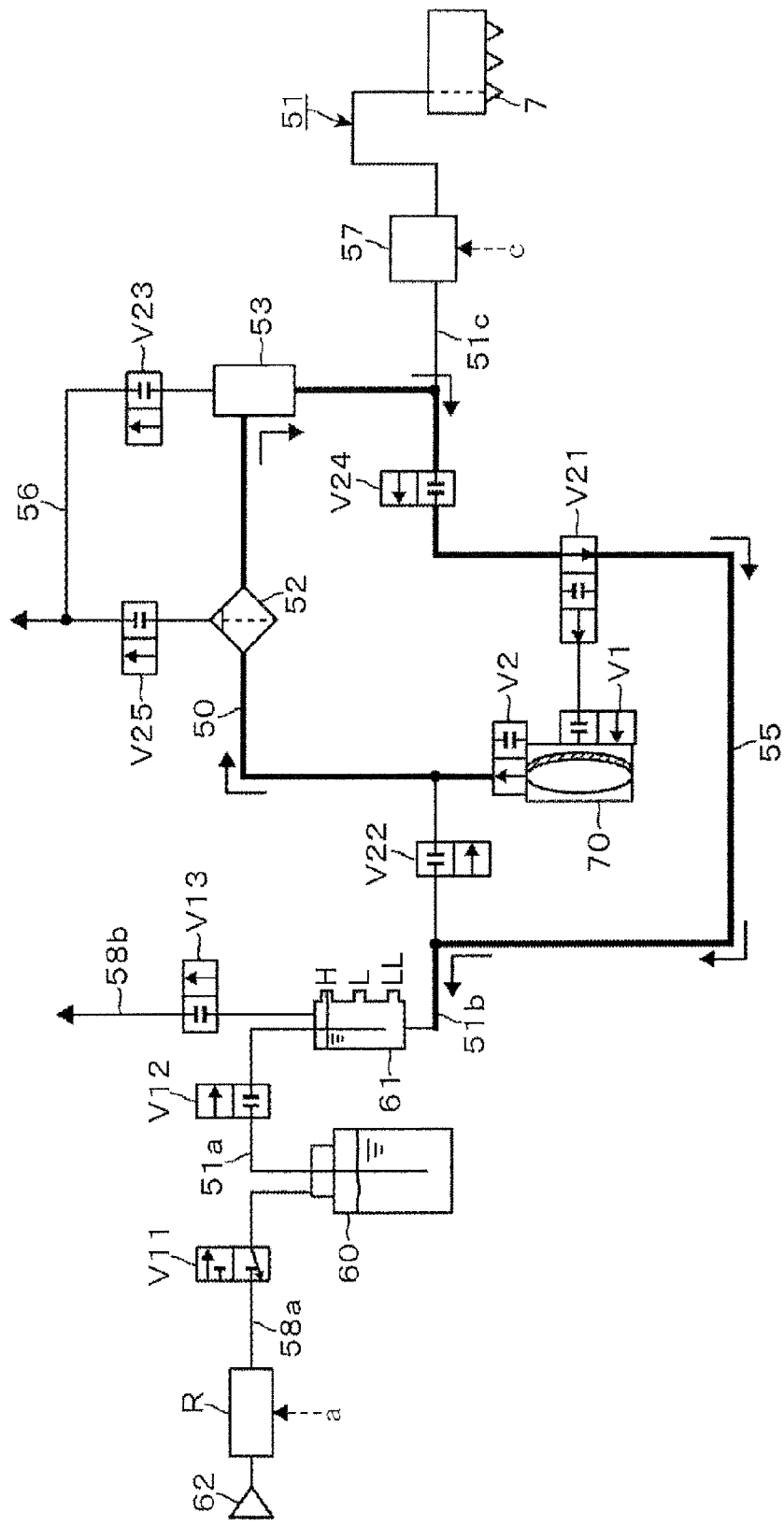
FIG. 23 is a piping diagram for explaining the returning step in the processing liquid supplying apparatus in another variation of the second embodiment.
Figure 24:
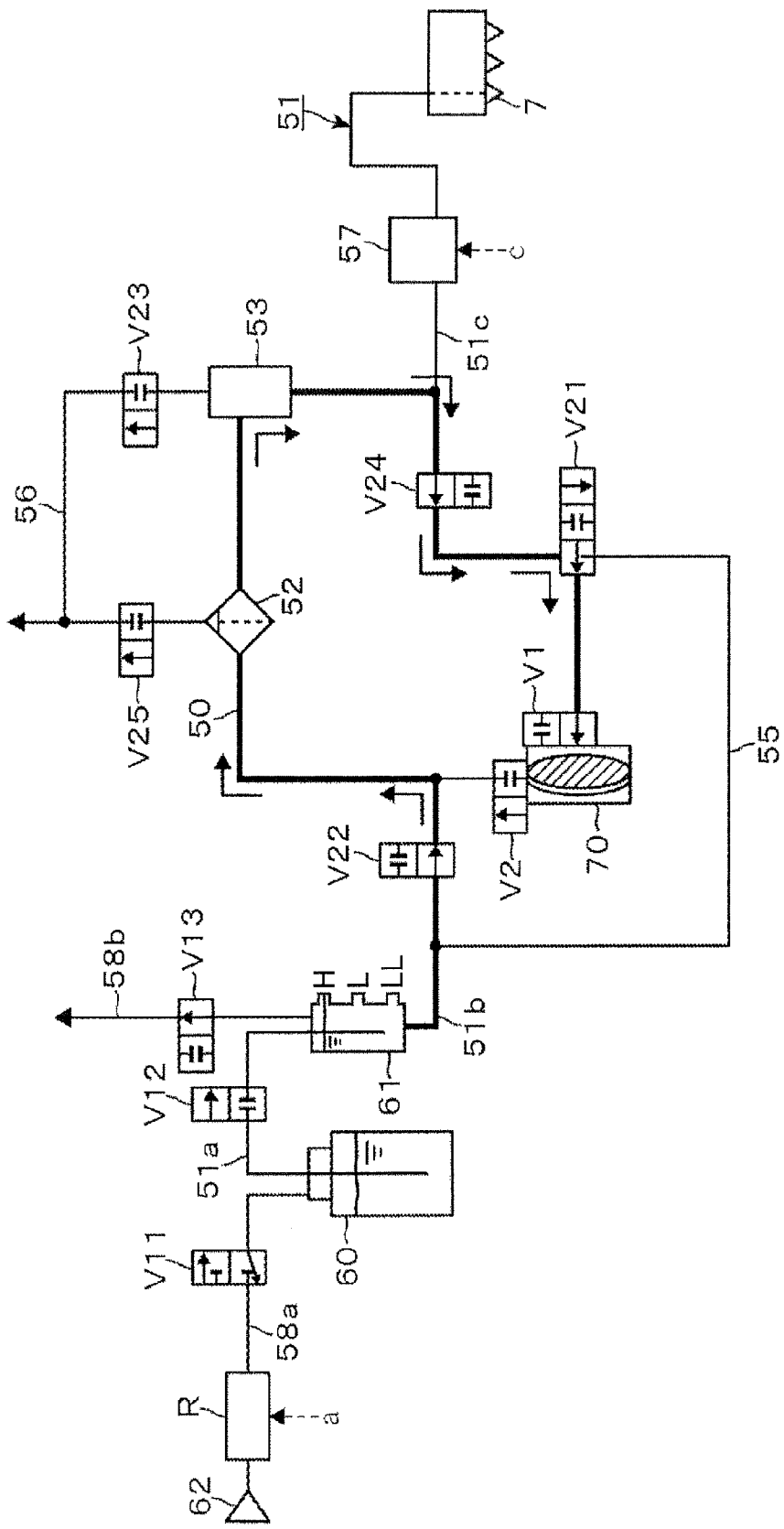
FIG. 24 is a piping diagram for explaining a replenishing step in the processing liquid supplying apparatus in another variation of the second embodiment.

As shown in FIGS. 22 to 24, the processing liquid supplying apparatus in another variation of the second embodiment may have a trap tank 53 provided on an intermediate pipeline 50b upstream of the connecting point at which the intermediate pipeline 50b is connected to the third processing liquid supplying pipeline 51c. In this variation, the shutoff valve V21 is constituted as a three-way valve. In a step where the resist liquid L is fed toward the nozzle 7 from the pump 70, as shown in FIG. 22, the shutoff valves V1 and V22 and the supply control valve 57 are opened, and a part of the resist liquid L is fed toward the nozzle 7 by the pump 70. At this time, the resist liquid L is supplied to the third processing liquid supplying pipeline 51c through the filter 52 and the trap tank 53. Then, the resist liquid L is ejected from the nozzle 7.

In the returning step (step S3) in which the remaining resist liquid L is returned to the second processing liquid supplying pipeline 51b from the pump 70, as shown in FIG. 23, the supply control valve 57 is closed, the shutoff valve V24 is opened, and the shutoff valve V21 connects a pipeline 50c to the return pipeline 55. The resist liquid L fed from the pump 70 passes through the filter 52 and the trap tank 53 in this order so as to be returned to the second processing liquid supplying pipeline 51b.

Further, in the operation (step S1) in which the resist liquid L returned to the second processing liquid supplying pipeline 51b and the resist liquid L replenished from the buffer tank 61 are mixed with each other, and the mixed resist liquid L is supplied to the pump 70, as shown in FIG. 24, the shutoff valve V2 is closed, and the shutoff valve 21 connects the pipeline 50c to the pump 70. In addition, the shutoff valve V13 is opened, so that the resist liquid in the buffer tank 61 is replenished to the second processing liquid supplying pipeline 51b. The resist liquid L flows through the replenishing passage 50 from the second processing liquid supplying pipeline 51b. At this time, the resist liquid L passes through the filter 52 and the trap tank 53 in this order, and then the resist liquid L is supplied to the pump 70.

Also in this variation, the resist liquid L passes through the filer 52 when the resist liquid L pushed out from the pump 70 is ejected from the nozzle 7 (step S1), when the resist liquid L remaining in the pump 70 is returned to the second processing liquid supplying pipeline 51b (step S3), and when in which the resist liquid L returned to the second processing liquid supplying pipeline 51b and the resist liquid L replenished from the buffer tank 60 are mixed with each other, and the mixed resist liquid L is sent to the pump 70 (step S1). Thus, similar advantageous effects can be achieved.

Next, the advantageous effects of the second embodiment are explained with reference to Table 1. In the circulating/reciprocating mixing filtration process where "n=5" the cycle time was 20.5 seconds, the normalized number of particles was "18", and the normalized number of particles relative to the one filtration was "82". In the circulating/reciprocating mixing filtration process where "n=5", the cycle time shorter than the cycle time required in the case where the resist liquid L was filtered only once could be achieved. As compared with the non-filtered resist liquid L, the number of particles could be reduced to 18%. As compared with the resist liquid L that was filtered only once, the number of particles could be reduced to 82%.

In the circulating/reciprocating mixing filtration process where "n=10", the cycle time was 26.0 seconds, the normalized number of particles was "8", and the normalized number of particles relative to one filtration was "36". Namely, in the circulating/reciprocating mixing filtration process where "n=10", the number of particles could be reduced to 8% as compared with the non-filtered resist liquid L, and the number of particles could be reduced to 36% as compared with the resist liquid that was filtered only once. In addition, as compared with the circulating/reciprocating mixing filtration process where "n=5", the number of particles could be reduced to 44%.

Thus, similarly to the first embodiment, the filtration efficiency can be improved while maintaining the throughput at the substantially the same level as that in the case where the resist liquid is filtered once by the filter. As a result, without significantly changing the apparatus configuration, a high filtration efficiency is achieved using only one filter, similar to a case where a plurality of filters are employed, while suppressing throughput reduction.

In addition, in the circulating/reciprocating mixing filtration process in the second embodiment, the resist liquid L is passed through the filter 52 also when the resist liquid L is returned to the second processing liquid supplying pipeline 51b. Thus, the second embodiment can further reduce the number of particles adhering to a wafer, as compared with the first embodiment.

Figure 25:
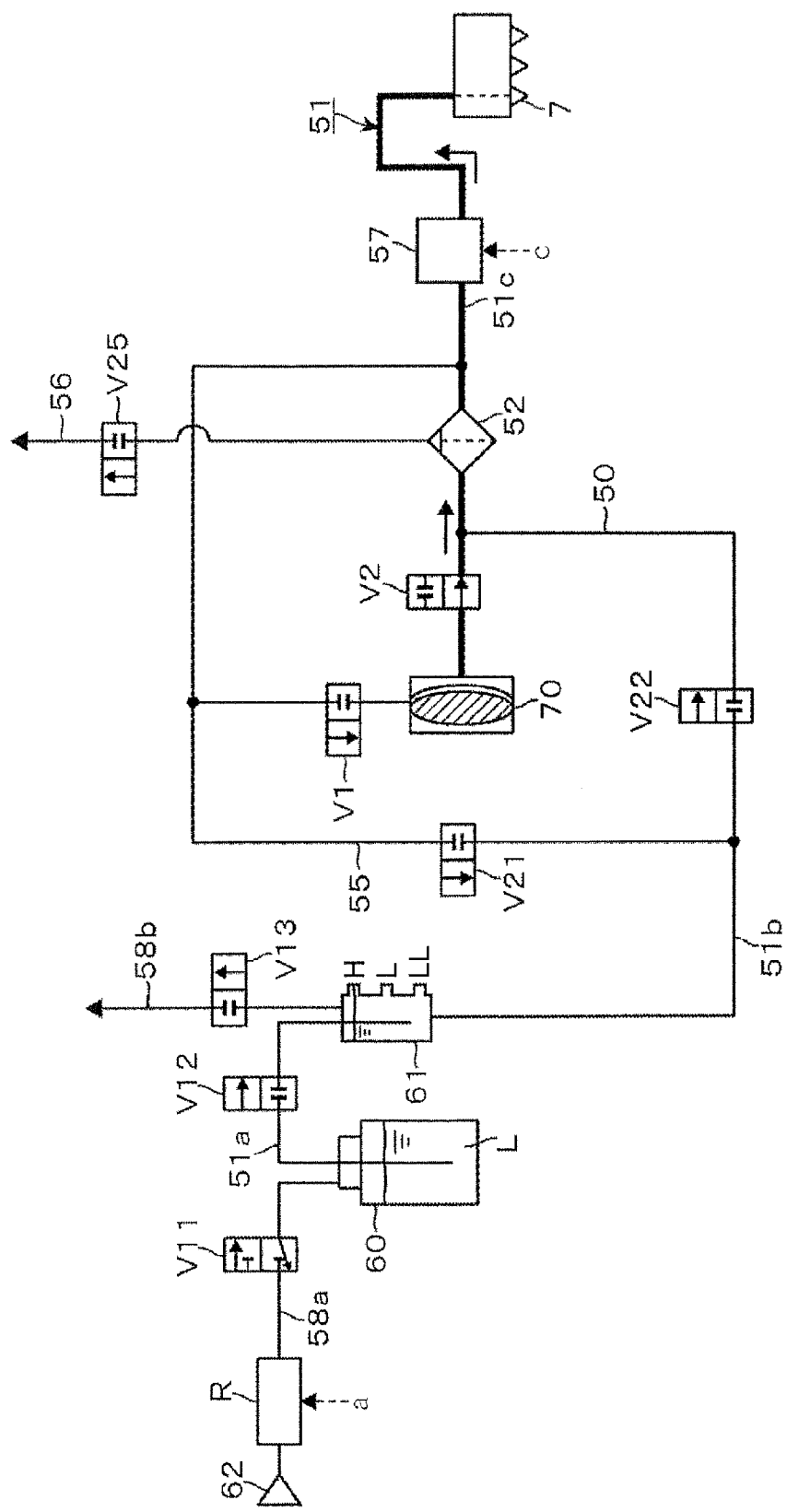
FIG. 25 is a piping diagram for explaining an ejecting step in the processing liquid supplying apparatus in yet another variation of the second embodiment.
Figure 26:
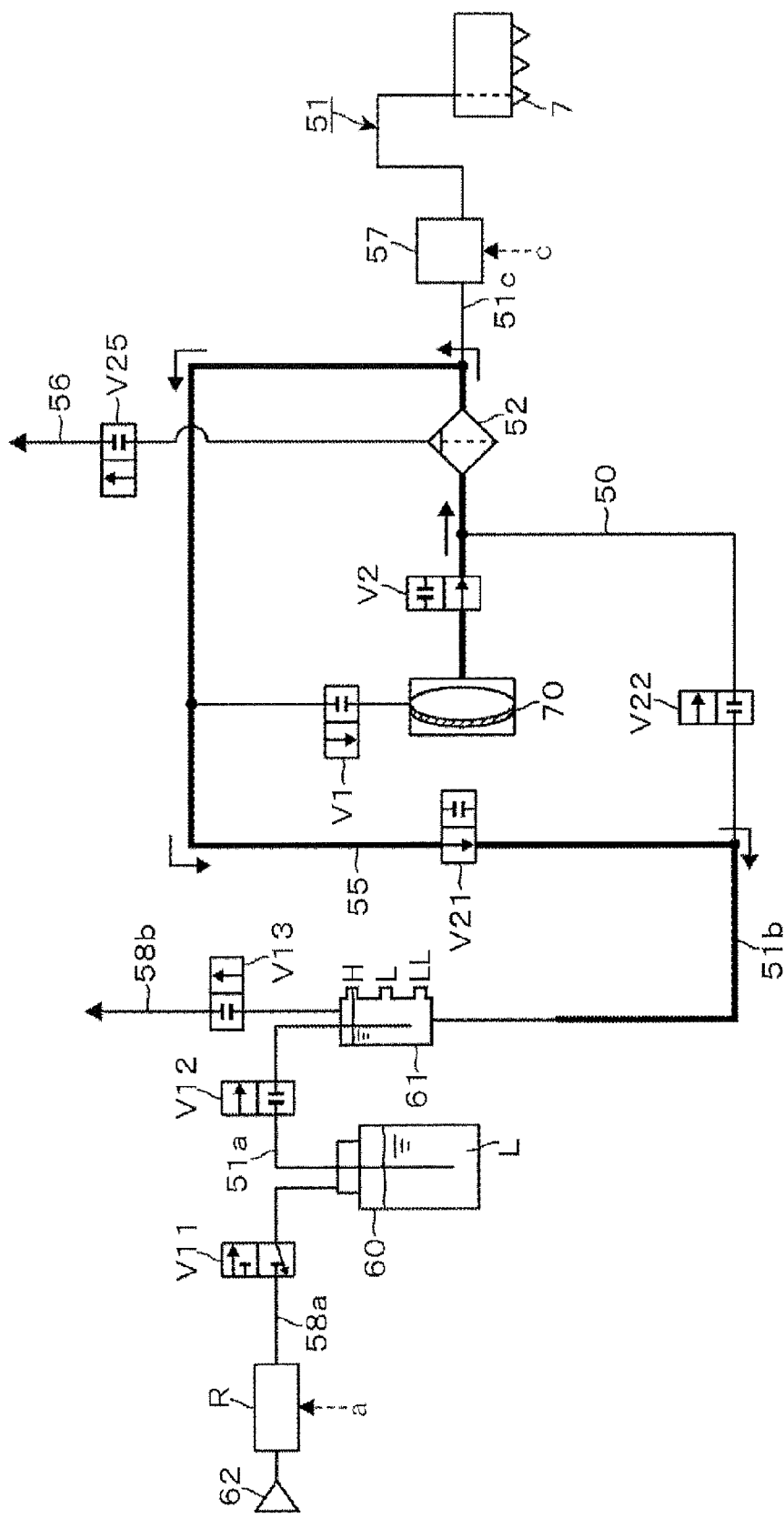
FIG. 26 is a piping diagram for explaining a returning step in the processing liquid supplying apparatus in yet another variation of the second embodiment.
Figure 27:
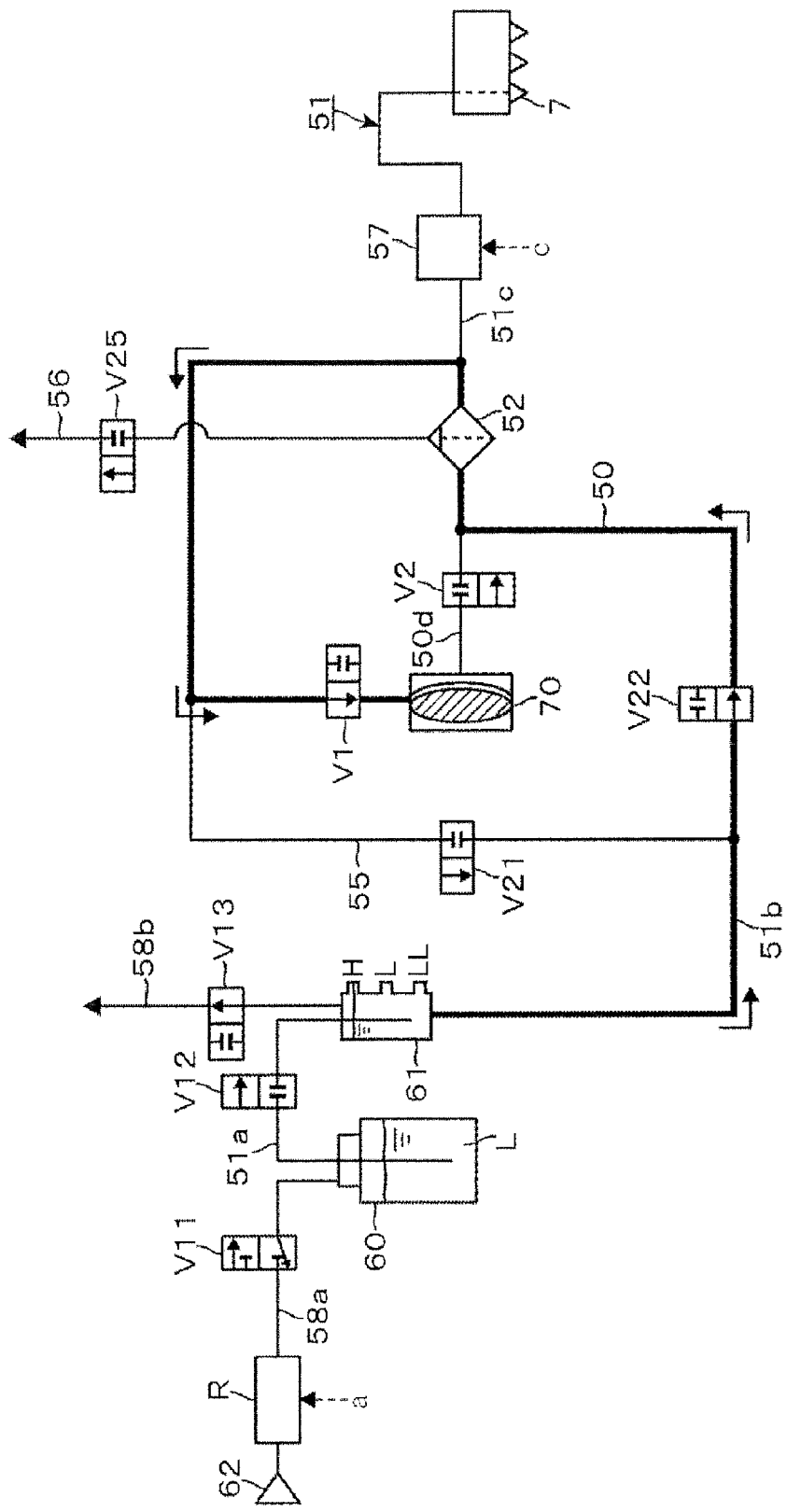
FIG. 27 is a piping diagram for explaining a replenishing step in the processing liquid supplying apparatus in yet another variation of the second embodiment.

In yet another variation of the second embodiment, a configuration without the trap tank 53 is possible. The processing liquid supplying apparatus shown in FIGS. 25 to 27 is configured by removing the trap tank 53 from the configuration shown in FIG. 18. In this variation, in the ejecting step (step S2) in which the resist liquid L is ejected from the nozzle 7, the shutoff valves V1 and V22 are closed, and the shutoff valve V2 and the supply control valve 57 are opened. Then, as shown in FIG. 25, a part of the resist liquid L suctioned in the pump 70 is pushed out to pass through the filter 52. After that, the resist liquid L flows into the third processing liquid supply pipeline 51c so as to be ejected to a wafer through the nozzle 7.

In the returning step (S3) in which the resist liquid L remaining in the pump 70 is returned to the second processing liquid supplying pipeline 51b, the supply control valve 57 is closed, and the shutoff valves V24 and V32 are opened. Then, as shown in FIG. 26, the remaining resist liquid L is pushed out from the pump 70 to flow through the return pipeline 55 so as to be returned to the second processing liquid supplying pipeline 51b. At this time, the resist liquid L pushed out from the pump 70 is returned to the second processing liquid supplying pipeline 51b after the resist liquid L has passed through the filter 52. Unlike the foregoing variations of the second embodiment, the resist liquid L does not pass through the trap tank 53.

In the operation (step 4) in which the resist liquid L returned to the second processing liquid supplying pie 51b and the resist liquid L in the buffer tank 61 are mixed with each other, and the mixed resist liquid L is supplied to the pump 70, as shown in FIG. 27, the shutoff valve V21 is closed, and the shutoff valves V22, V13 and V1 are opened. Then an amount of the resist liquid L equivalent to the amount of the resist liquid L having been ejected to the wafer W is replenished to the second processing liquid supplying pipeline 51b from the buffer tank 61. Then, the resist liquid L replenished from the buffer tank 61 and the resist liquid L returned to the second processing liquid supplying pipeline 51b are mixed with each other, and the mixed resist liquid L is suctioned into the pump 70. At this time, the resist liquid L in the second processing liquid supplying pipeline 51b is supplied to the pump 70 through the filter 52.

Figure 28:
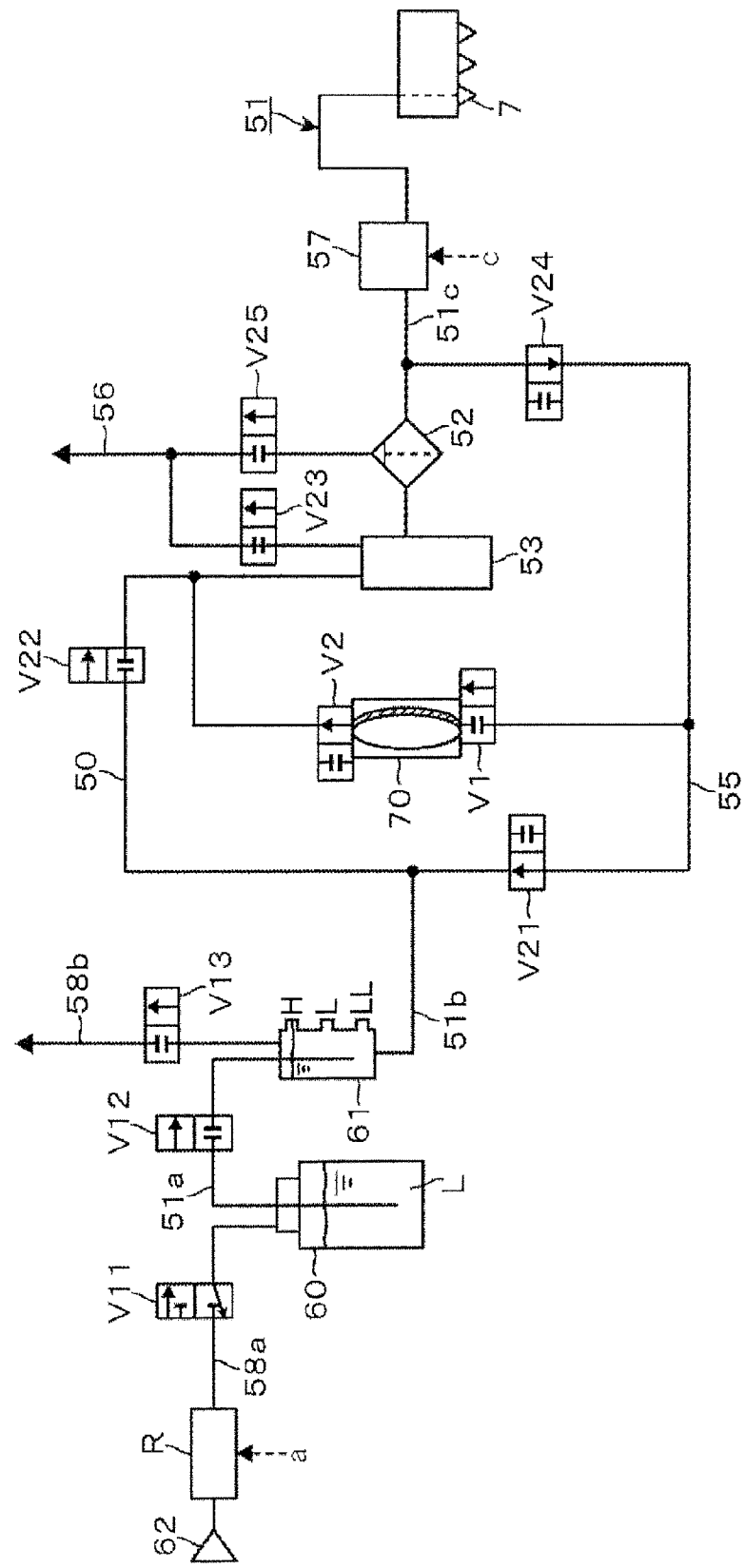
FIG. 28 is a piping diagram showing the structure of the processing liquid supplying apparatus according to the still yet another variation of the second embodiment.

Thus, also in this operation, unlike the foregoing variations of the second embodiment, the resist liquid L does not pass through the trap tank 53. Also in this variation, the resist liquid L passes through the filter 52 when the resist liquid pushed out from the pump 70 is ejected from the nozzle 7 (step S2), when the resist liquid L remaining in the pump 70 is returned to the second processing liquid supplying pipeline 51b (step S3), and when the resist liquid L returned to the second processing liquid supplying pipeline 51b and the resist liquid L supplied from the buffer tank 60 are mixed, and the mixed resist liquid L is sent to the pump 70 (step S4). Thus, similar advantageous effects can be achieved. Furthermore, in the another variation of the second embodiment, as shown in FIG. 28, the trap tank 53 may be located on a pipeline commonly shared by the replenishing passage 50 and the return pipeline 55 at a position on the primary side of the filter 52 in the replenishing passage 50.

<Third Embodiment>

Figure 29:
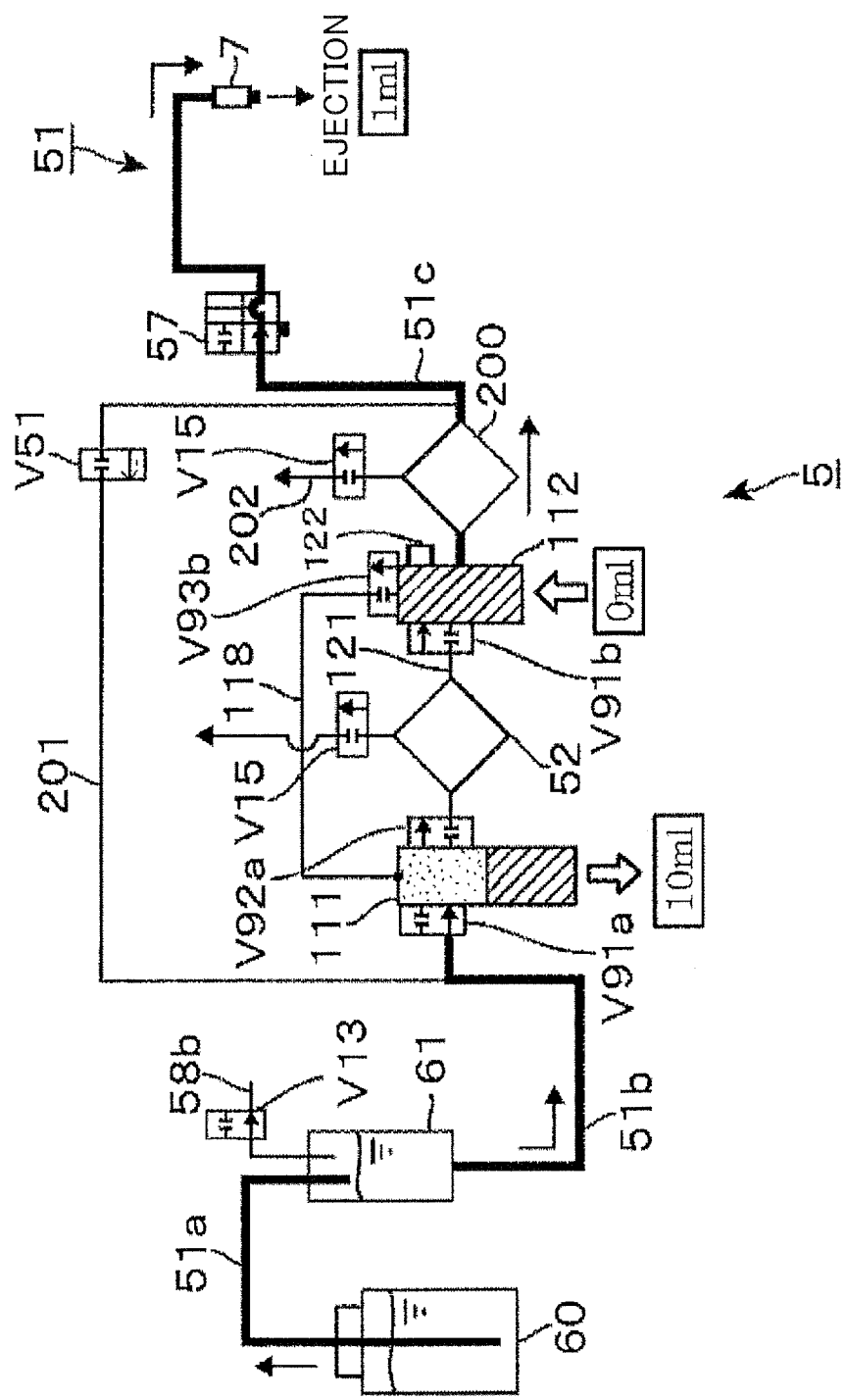
FIG. 29 is a piping diagram showing the structure of the processing liquid supplying apparatus and an ejecting operation thereof in a third embodiment.
Figure 30:
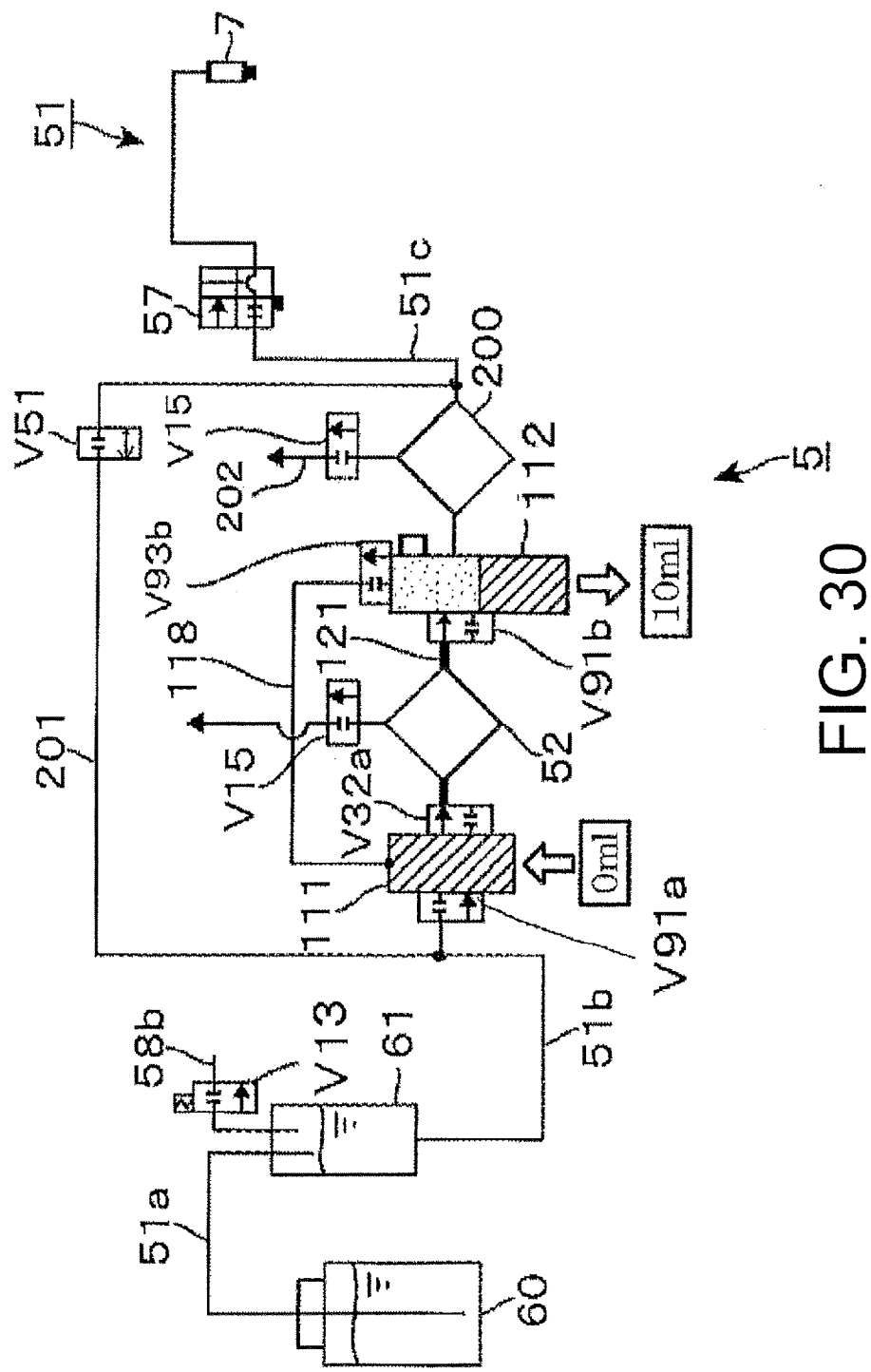
FIG. 30 is a piping diagram for explaining a processing liquid feeding operation in the processing liquid supplying apparatus in the third embodiment.
Figure 31:
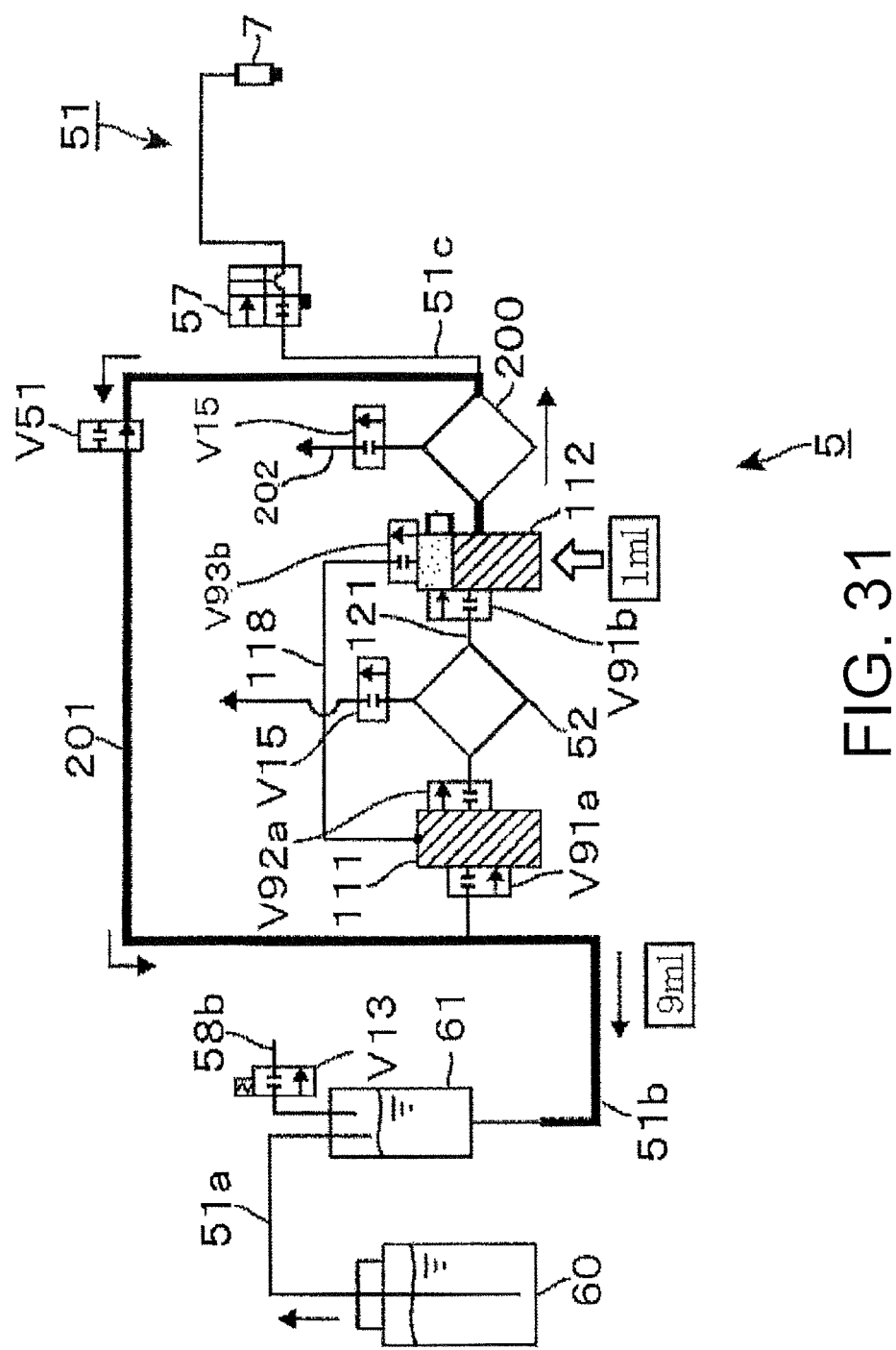
FIG. 31 is a piping diagram for explaining a returning step in the processing liquid supplying apparatus in the third embodiment.
Figure 32:
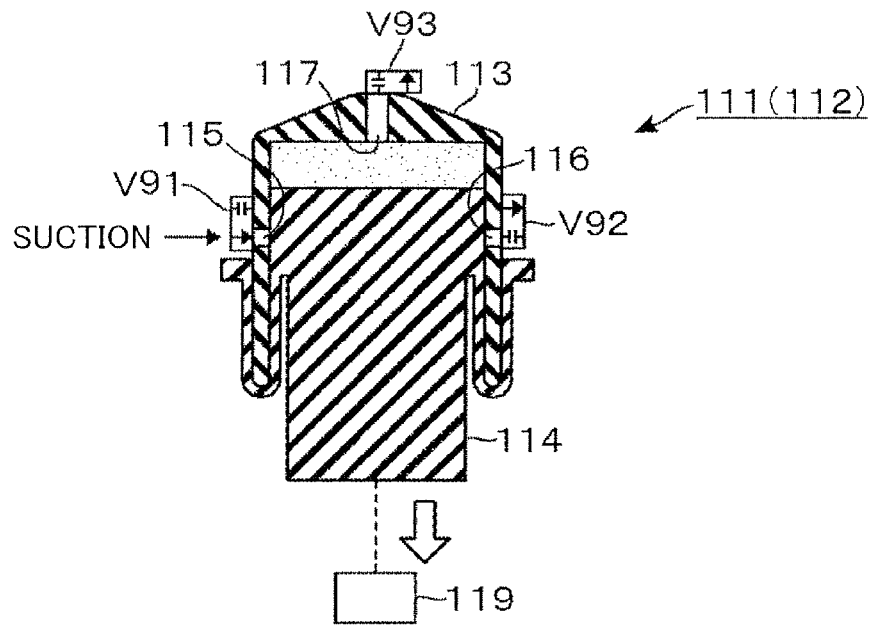
FIG. 32 is a schematic cross sectional view showing the structure of a pump used in the third embodiment.

Next, a third embodiment of the present invention will be explained with reference to FIGS. 29 to 33. In order to perform the mixing filtration process like the first embodiment, the third embodiment includes a feed pump 111 and a discharge pump 112 as shown in FIGS. 29 to 31. The feed pump 111 is disposed on a second processing liquid supplying pipeline 51b on the primary side of a filter 52, and the discharge pump 112 is disposed on a third processing liquid supplying pipeline 51c on the secondary side of the filter 52. As shown in FIG. 32, syringe pumps are used as these pumps 111 and 112, for example. To be specific, each of the pumps 111 and 112 includes an outer member 113 of a substantially cylindrical shape, and a retractable member 114 of a cylindrical shape. One surface side of the outer member 113 is opened. The retractable member 114 is inserted inside the outer member 113 so as to be retractable from the one side surface to the other side surface.

Another filter 200 is provided on the secondary side of the discharge pump 112. One end of a return passage 201 is connected to the third processing liquid supplying pipeline 51c between the filter 200 and a supply control valve 57. The other end of the return passage 201 is connected to the second processing liquid supplying pipeline 51b at a junction between a buffer tank 61 and the feed pump 111 through a shutoff valve V51. In FIGS. 29 to 30, the reference numeral 202 depicts a vent pipeline through which bubbles are discharged from the filter 200, and V52 depicts a shutoff valve disposed on the vent pipeline 202.

A suction port 115 for sucking a resist liquid L from a processing liquid container 60, and a supply port 116 for supplying the resist liquid L toward a wafer are formed in a circumferential wall of the outer member 113, with these ports 115 and 116 being diametrically opposed to each other. In addition, a return port 117 for returning the resist liquid L toward the filter 52 is formed in the distal end wall of the outer member 113 to oppose to the retractable member 114.

Figure 33:
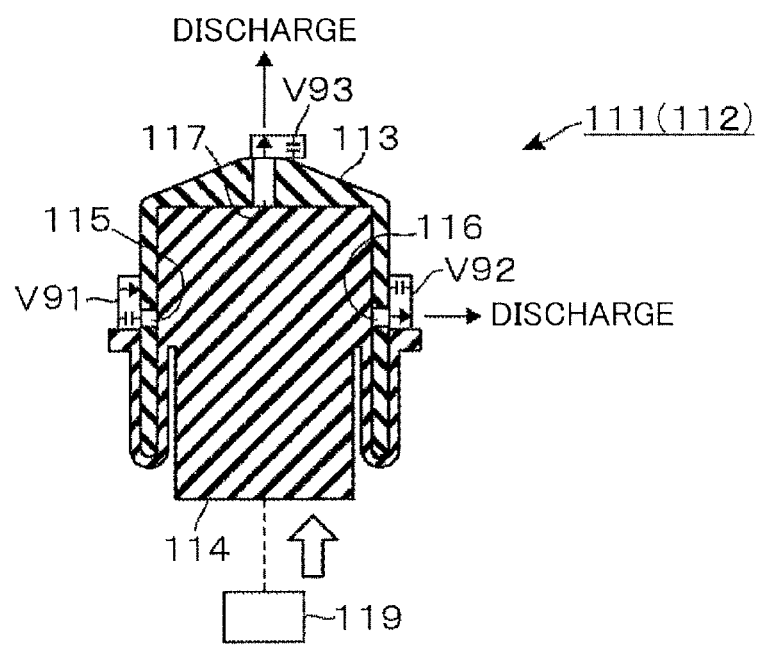
FIG. 33 is a schematic cross sectional view showing the structure of the pump used in the third embodiment.

The return port 117 connected to a return passage 118. Flow passages (second processing liquid supplying pipeline 51b, third processing liquid supplying pipeline 51c and return passage 118) extending from the suction port 115, the supply port 116 and the return port 117 are respectively provided with shutoff valves V91, V92 and V93. FIGS. 32 and 33 schematically illustrate the positions these shutoff valves V91 to V93, which are located near the pumps 111 and 112.

The retractable member 114 is integrated with a driving unit 119 such as a stepping motor or a servomotor, so that the retractable member 114 moves forward and backward, with the circumference of the end part of the retractable member 114 being air-tightly in contact with the opening end of the outer member 113. Thus, when the shutoff valve V91 is opened while the shutoff valves V92 and V93 are closed, and the retractable member 114 is moved in a direction in which the retractable member 114 is pulled out from the outer member 113, as shown in FIG. 30, the resist liquid L is drawn into the interior of the outer member 113 from the second liquid processing pipeline 51b through the suction port 115.

On the other hand, when the shutoff valve V91 is closed while the shutoff valve V92 or the shutoff valve V93 is opened, and the retractable member 114 is pushed into the inside of the outer member 113, the resist liquid L is discharged toward the third processing liquid supplying pipeline 51c (return passage 118) through the shutoff valve 32 (shutoff valve V93). A liquid supply amount (liquid storage amount) of each of the pumps 111 and 112 is 30 ml, for example. In the below description, the operation for pushing the retractable member 114 into the interior of the outer member 113 is referred to as "operation for moving forward the retractable member 114", and the operation for drawing out the retractable member 114 from the interior of the outer member 113 is referred to as "operation for moving backward the retractable member 114".

The description returns to the explanation about the structure of the processing liquid supplying apparatus including these pumps 111 and 112, as shown in FIG. 29. A connecting path 121 provided with the aforementioned filter 52 is disposed between the pumps 111 and 112. The connecting path 121 has an open end on the upstream side, which is connected to the supply port 116 of the feed pump 111; and an open end on the downstream side, which is connected to the suction port 115 of the discharge pump 112. In addition, the return passage 118 is disposed between the pumps 111 and 112. The return port 117 of the pump 111 and the return port 117 of the pump 112 are connected with each other through the return passage 118.

Herein, for the convenience, suffixes "a" are added to shutoff valves V91 to V93 associated with the feed pump 111, and suffixes "b" are added to shutoff valves V91 to V93 associated with the discharge pump 112. As shown in FIG. 29, the shutoff valve V93a of the feed pump 111 and the shutoff valve V93b of the discharge pump 112 are commonized. In addition, the shutoff valve V92b of the discharge pump 112 and a supply control valve 57 are commonized. In FIG. 29, the reference numeral 122 depicts a manometer for measuring the pressure of the resist liquid L in the discharge pump 112.

Next, the detailed operation for the mixing filtration process using the pumps 111 and 112 is explained. The initial condition is as follows. Namely, in the feed pump 111, the retractable member 114 is fully pushed into the interior of the outside member 113, so that an amount of the resist liquid L charged in the pump 111 is zero. On the other hand, in the discharge pump 112, the retractable member 114 is slightly moved backward, so that 1 ml of the resist liquid L is charged, for example. The shutoff valves V91 to V93 and the supply control valve 57 are closed.

After establishing the aforementioned initial condition, an ejecting operation of the resist liquid L toward a wafer, and a replenishing operation of the resist liquid L to the feed pump 111 are performed. To be specific, as shown in FIG. 29, the supply control valve 57 and the shutoff valve V13 are opened, and the retractable member 114 of the discharge pump 112 moves forward, so that the amount of the resist liquid L charged in the feed pump 111 increases from 0 ml to 10 ml, for example. On the other hand, the amount of the resist liquid L charged in the discharge pump 112 decreases from 1 ml to 0 ml, and the resist liquid L is ejected from the nozzle 7 through the filter 200. At this time, the shutoff valves V51 and V15 are closed. The ejecting operation and the replenishing operation are performed simultaneously. The ejecting operation is referred to as "ejecting step".

Herein, the aforementioned term "simultaneously" covers not only a case in which the operation start timings of the pumps 111 and 112 are exactly the same and the operation finish timings of the pumps 111 and 112 are exactly the same, but also a case in which, after one of the pumps 111 and 112 starts the operation and before the one of the pumps 111 and 112 finish the operation, the other of the pumps 111 and 112 is operating. That is, aforementioned term "simultaneously" covers the case in which a period of time where the ejecting operation of the resist liquid L and a period of time where the replenishing operation of the resist liquid L are overlapped with each other. In FIG. 29, the stored amounts of the resist liquid L in the pumps 111 and 112 are described below the pumps 111 and 112. This holds true with the succeeding FIGS. 30 and 31. In FIGS. 29 to 31, illustration of the apparatus structure is simplified.

Then, as shown in FIG. 30, the shutoff valve 91a of the feed pump 111 is closed, and the shutoff valve 92a is opened. In addition, the shutoff valve V91b of the discharge pump 112 is opened, and the supply control valve 57 is closed. Then, by moving forward the retractable member 114 of the feed pump 111 and by moving backward the retractable member 114 of the discharge pump 112, the resist liquid L in the feed pump 111 passes through the filter 52 so that foreign matters and bubbles are removed therefrom. After that, the resist liquid L moves into the discharge pump 112. At this time, if air vent for removing bubbles remaining in the filter 52 is to be performed continuously to the filtration operation of the resist liquid L, about 0.5 to 1 ml of the resist liquid L is left in the feed pump 111, although the amount of the resist liquid remaining in the feed pump 111 is described as 0 ml in FIG. 30. The filtration operation and the aforementioned replenishing operation correspond to the replenishing step.

The bubble removal operation is performed by the following manner. Namely, the shutoff valve V15 above the filter 52 is opened, and the shutoff valve V91b of the discharge pump 112 is closed. Then, the retractable member 114 of the feed pump 111 is slightly moved forward (such that about 0.5 to 1 ml of the resist liquid L is discharged), the bubbles remaining in the filter 52 are removed therefrom together with the resist liquid L.

Thereafter, as shown in FIG. 31, the shutoff valve V91a of the feed pump 111 is opened, and the shutoff valve V92a is closed. In addition, the shutoff valve V93b of the discharge pump 112 is opened, and the shutoff valve V15 is closed. Further, if the bubble removal operation of the filter 52 was not performed, the shutoff valve V91b of the discharge pump 112 is closed. Then, by moving forward the retractable member 114 of the discharge pump 112, the resist liquid L in the discharge pump 112 passes through the filter 200 to reach the secondary side of the buffer tank 61 (primary side of the feed pump 111) through the return passage 201. Thus, until an amount (9 ml) of the resist liquid L exceeding an amount (1 ml) of the resist liquid L required for processing a succeeding wafer, or until a given amount (1 to 9 ml) of the resist liquid L is discharged from the discharge pump 112, the retractable member 114 of the discharge pump 112 is moved forward. The operation shown in FIG. 31 is "returning step".

FIG. 31 shows the initial condition. Thus, following thereto, when the resist liquid L is replenished into the feed pump 111, the resist liquid L, which has been returned to the buffer tank 61 through the filter 52 in the second processing liquid supplying pipeline 51b, passes through the filter 52 again. Therefore, a process similar to the mixing filtration process explained in the first embodiment is performed. After that, a series of steps, i.e., the ejecting operation of the resist liquid L toward a wafer, the returning operation for returning the resist liquid L in the discharge pump 112 to the primary side of the filter 52, the drawing operation of the resist liquid L into the feed pump 111, and the operation for passing the resist liquid L through the filter 52, are repeated.

By performing the mixing filtration process by using the arrangement in which the pumps 111 and 112 are disposed on both sides of the filter 52, in addition to an advantageous effect similar to that of the first embodiment, the following advantageous effect can be achieved. Namely, the discharge pressure of the feed pump 111 can be used for transporting the resist liquid L toward the discharge pump 112 through the filter 52. Accordingly, the internal pressure of the connecting path 121 can be maintained at a positive pressure, and thus penetration of bubbles into the connecting path 121 can be prevented. Thus, the trap tank 53 provided in the foregoing first embodiment is no longer necessary. In addition, when the resist liquid L passes through the filter 52, the suctioning pressure of the discharge pump 112 for suctioning the resist liquid L into the discharge pump 112 can be utilized, in addition to the discharge pressure of the feed pump 111 for discharging the resist liquid L from the feed pump 111. Thus, the pressure in the filter 52 can be easily controlled.

Further, since the piping configuration can be simplified as compared with that shown in FIG. 1, the cost increase of the apparatus and the pressure loss occurred in the pipelines can be restrained. Moreover, since the ejecting operation of the resist liquid L to a wafer and the sucking operation of the resist liquid L from the buffer tank 61 can be simultaneously performed, the process for ejecting the resist liquid L to a succeeding wafer can be promptly performed.

When the resist liquid L is sent to the nozzle 7, the resist liquid L passes through the filter 200. Thus, even if particles are generated in the discharge pump 112, the particles can be captured and the clean resist liquid L can be supplied to a wafer. In addition, when the resist liquid L in the discharge pump 112 is returned to the primary side of the feed pump 111, the resist liquid L passes through the filter 200. Thus, even if particles are generated in the discharge pump 112, the particles can be captured.

When the circulating mixing filtration process or the circulating/reciprocating mixing filtration process is performed, as can be understood from FIG. 11, it is preferable that the return amount "b" of the resist liquid L to the primary side of the filter 52 is equal to or greater than the supply amount "a" of the resist liquid L to a wafer. However, if the return amount "b" of the resist liquid L to the primary side of the filter 52 is excessively larger than the supply amount "a" of the resist liquid L to a wafer W, a longer time is required for the process. On the other hand, if the return amount "b" is excessively smaller than the supply amount "a", the cleaning (filtering) effect of the resist liquid is reduced. Thus, the ratio "a:b" is preferably 1:1 to 1:20, more preferably 1:1 to 1:10, and more preferably 1:1 to 1:5.

In a case where the two pumps 111 and 112 are employed as described above, the aforementioned trap tank 53 may be disposed at least one of the following locations: a location between the processing liquid container 60 and the feed pump 111; a location between the feed pump 111 and the filter 52; a location between the filter 52 and the discharge pump 112; and a location between the discharge pump 112 and the nozzle 7. In the third embodiment, for the feeding operation, only the discharge pump 112 on the secondary side of the filter 52 may be used without using the feed pump 111, so that the resist liquid L is suctioned and fed like the first embodiment and the second embodiment.

In the above embodiments, the ejecting step S2 is firstly performed and then the returning step S3 is performed. However, the order of these steps may be reversed. Thus, the returning step S3 may be firstly performed and then the ejecting step S2 may be performed.

In addition, in the above embodiments, the returning step S3 is performed after the ejecting step S2 has been performed once. However, not limited thereto, the returning step S3 may be performed after the ejecting step S2 has been performed twice. In this case, 1 ml of the resist liquid may be succeedingly supplied to two wafers, and 4 ml of the resist liquid may be returned to the processing liquid source side of the mixing section through the return passage.

In addition, in the above embodiments, the ejecting step S2 is performed with the use of a part of the resist liquid suctioned into the pump, and the returning step S3 is performed with the use of the remaining resist liquid. However, not limited thereto, the ejecting step S2 may be performed after sucking into the pump 1 ml of the resist liquid which is to be ejected to a wafer W in the ejecting step S2, and thereafter the returning step S3 may be performed after sucking into the pump 4 ml of the resist liquid which is to be returned in the returning step S3.

The processing liquid is not limited to the resist liquid L, and may be a coating liquid containing a precursor of an insulation film, a developer, and so on.

In the aforementioned first to third embodiments, there are performed a set of steps, i.e., the ejecting step for ejecting the resist liquid L in the pump 70 (ejecting pump 12) to a wafer and the returning step for returning the resist liquid L remaining in the pump 70 (discharge pump 112) to the primary side of the filter 52, and the set of these steps are repeated. Thus, even when the resist liquid L is being ejected to a wafer (in other words, even when the apparatus is not in the idling or standby condition but in the operation condition), foreign matters and bubbles contained in the resist liquid L can be removed.

Instead of alternately repeating the ejecting operation and the returning operation, the following operation is possible. Namely, after the ejecting operation has been performed plural times, the retuning operation is performed once, and then the ejecting operation is further performed plural times. To be specific, when the resist liquid L is returned to the primary side of the filter 52 from the pump 70 (discharge pump 112), the resist liquid L of an amount equivalent to an amount required for the ejecting operation of plural times (e.g., twice) is left in the pump 70 (discharge pump 112). Then, the resist liquid L remaining in the pump 70 (discharge pump 112) is discharged successively to a plurality of wafers. Thereafter the resist liquid L is replenished to the pump 70 (discharge pump 112) through the filter 52.

In the foregoing embodiments, in the returning step, all the resist liquid L remaining in the pump may be returned, or a part of the resist liquid L remaining in the pump may be returned.

In addition, in the first to third embodiments, when the resist liquid L is replenished to the pump (70, 111) after the resist liquid L has been ejected from the nozzle 7, the resist liquid of an amount equivalent to the amount of the resist liquid L having been ejected from the nozzle 7 is replenished. However, the ejecting amount and the replenishing amount of the resist liquid L to be replenished to the pump (70, 111) may be different from each other. Namely, in the case of the pump 70, an amount of the resist liquid L drawn into the pump 70 may be set to any given value by adjusting the supply amount of air to be supplied to the working chamber 73. Also, in the case of the pump 111, an amount of the resist liquid L drawn into the pump 111 may be set to any given value by adjusting the moving distance of the retractable member 114.

The operation, in which the ejecting amount and the replenishing amount are different from each other, is explained below. For example, in the (2n−1)-th operation ("n" is a natural number), the ejecting amount of the resist liquid to be ejected is set 0.5 ml, the returning amount of the resist L to be returned to the primary side of the filter 52 is set 2.4 ml, and the replenishing amount of the resist liquid L to be replenished is set 0.6 ml. Then, in the 2n-th operation, the ejecting amount, the returning amount and the replenishing amount are respectively set 0.5 ml, 2.6 ml and 0.4 ml.

In the third embodiment, at least one of the pumps 111 and 112 having the structure of FIG. 32 may be replaced with the pump 70 employed in the first and second embodiments.

What is claimed is:

1. A processing liquid supplying apparatus that supplies a processing liquid supplied from a processing liquid source via an ejecting part to a process object, said apparatus comprising:

a processing liquid supplying passage connecting the processing liquid source to the ejecting part;

a mixing section having a circulation passage that has a first connection point and a second connection point directly on the processing liquid supplying passage, the first connection point is located at a point near the processing liquid source in the processing liquid supplying passage and the second connection point is located at a point near the ejecting part in the processing liquid supplying passage, which is provided thereon with a pump and a filter device connected to a secondary side of the pump, the mixing section being disposed on the processing liquid supplying passage between the processing liquid source and the ejecting part to allow the processing liquid having been passed through the filter device and the processing liquid replenished from the processing liquid source to be mixed with each other; and a control section configured to output a control signal, upon receipt of which the processing liquid supplying apparatus performs: an ejecting step in which the processing liquid having been suctioned into the pump passes through the filter device and is ejected from the ejecting part without returning the processing liquid back to the pump; a returning step in which the processing liquid having been suctioned into the pump is returned to a processing liquid source side of the mixing section; and a replenishing step in which the processing liquid having been returned to the processing liquid source side is suctioned into the pump together with the processing liquid replenished from the processing liquid source, wherein:

a return passage is provided to connect a secondary side of the filter device and a part of the processing liquid supplying passage extending from the processing liquid source;

a replenishing passage is formed by a flow passage having one end connected to a connecting point between the secondary side of the pump and a primary side of the filter device, and a flow passage connecting to a connecting point between the secondary side of the filter device and a primary side of the pump;

in the replenishing step, the processing liquid having been returned to the processing liquid source side and the processing liquid supplied from the processing liquid source are suctioned into the pump through the return passage;

the filter device is disposed to allow the processing liquid to pass through the filter device in at least one of the returning step and the replenishing step, and an amount of the processing liquid returned to the processing liquid source side in the returning step is larger than an amount of the processing liquid ejected from the ejecting part in the ejecting step.

2. The processing liquid supplying apparatus according to claim 1, wherein:

the ejecting step ejects a part of the processing liquid, having been suctioned into the pump in the replenishing step, from the ejecting part; and the returning step returns another part of the processing liquid, having been suctioned into the pump in the replenishing step, to the processing liquid source side of the mixing section.

3. The processing liquid supplying apparatus according to claim 1, wherein an amount of the processing liquid replenished from the processing liquid source in the replenishing step is equivalent to the amount of the processing liquid ejected from the ejecting part in the ejecting step.

4. The processing liquid supplying apparatus according to claim 1, wherein a part of the return passage serves as the flow passage connecting the secondary side of the filter device and the primary side of the pump.

* * * * *